US012677568B2

(12) United States Patent
Kim et al.

(10) Patent No.: US 12,677,568 B2
(45) Date of Patent: Jul. 7, 2026

(54) DISPLAY DEVICE AND METHOD OF MANUFACTURING THE DISPLAY DEVICE

(71) Applicant: SAMSUNG DISPLAY CO., LTD., Yongin-si (KR)

(72) Inventors: Wonseok Kim, Yongin-si (KR); Jeongin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 515 days.

(21) Appl. No.: 18/131,779

(22) Filed: Apr. 6, 2023

(65) Prior Publication Data
US 2023/0329067 A1      Oct. 12, 2023

(30) Foreign Application Priority Data

Apr. 7, 2022      (KR) ......................... 10-2022-0043637

(51) Int. Cl.
*H10K 59/80*      (2023.01)
*H10K 71/13*      (2023.01)

(52) U.S. Cl.
CPC ......... *H10K 59/873* (2023.02); *H10K 71/135* (2023.02)

(58) Field of Classification Search
CPC .... H10K 71/135; H10K 71/80; H10K 71/111; H10K 59/121; H10K 59/873
See application file for complete search history.

(56) References Cited

U.S. PATENT DOCUMENTS

| | | | |
|---|---|---|---|
| 2019/0375195 A1 | 12/2019 | Choi et al. | |
| 2020/0160761 A1* | 5/2020 | Ahn | H10K 59/871 |
| 2020/0303479 A1 | 9/2020 | Kim et al. | |
| 2021/0318770 A1* | 10/2021 | Joo | G06F 3/0412 |
| 2021/0376038 A1* | 12/2021 | Won | H10K 59/1213 |
| 2021/0384465 A1* | 12/2021 | Park | H10K 59/873 |
| 2022/0013596 A1* | 1/2022 | Kim | G06F 1/1652 |
| 2022/0052141 A1* | 2/2022 | Lee | H10K 59/123 |
| 2022/0077242 A1* | 3/2022 | Yoon | G06F 1/1637 |
| 2022/0085327 A1* | 3/2022 | Kim | H10K 59/8722 |
| 2022/0102462 A1 | 3/2022 | Zhou et al. | |

FOREIGN PATENT DOCUMENTS

| | | |
|---|---|---|
| CN | 112133733 A | 12/2020 |
| KR | 1020180000822 A | 1/2018 |
| KR | 1020180098890 A | 9/2018 |
| KR | 1020200077656 | 7/2020 |
| KR | 1020200113055 A | 10/2020 |
| KR | 1020210127281 A | 10/2021 |
| KR | 1020220036404 A | 3/2022 |

* cited by examiner

*Primary Examiner* — Vongsavanh Sengdara

(74) *Attorney, Agent, or Firm* — CANTOR COLBURN LLP

(57)      ABSTRACT

A display device includes a substrate including a central area and a corner area, the corner area extending in a direction away from the central area and including a plurality of extension areas including distal portions spaced apart from each other, a plurality of display elements arranged on a front surface of the substrate and arranged in the central area and the plurality of extension areas, and a first organic filler between adjacent extension areas among the plurality of extension areas. The first organic filler is between distal portions of the adjacent extension areas, and the adjacent extension areas and the first organic filler are disposed on a curved surface of the substrate that is different from a surface of the substrate on which the central area is disposed.

10 Claims, 24 Drawing Sheets

DISPLAY DEVICE AND METHOD OF MANUFACTURING THE DISPLAY DEVICE

This application claims priority to Korean Patent Application No. 10-2022-0043637, filed on Apr. 7, 2022, and all the benefits accruing therefrom under 35 U.S.C. § 119, the content of which in its entirety is herein incorporated by reference.

BACKGROUND

1. Field

Embodiments relate to a display device, in which an image display area is expanded, and a method of manufacturing the display device.

2. Description of the Related Art

Mobile electronic devices are widely used. As mobile electronic devices, not only small electronic devices, such as mobile phones, but also tablet personal computers are widely used.

Such mobile electronic devices include display devices to provide various functions, e.g., to provide visual information, such as images or videos, to users. Recently, as other parts for driving display devices have been miniaturized, the proportion occupied by display areas in display devices has gradually been increasing. A structure that is bendable to have a predetermined angle from a flat state is also under development.

SUMMARY

Embodiments include a display device, in which reliability is improved and an image display area is expanded, and a method of manufacturing the display device.

Additional features will be set forth in part in the description which follows and, in part, will be apparent from the description, or may be learned by practice of the presented embodiments of the disclosure.

In an embodiment of the disclosure, a display device includes a substrate including a central area and a corner area, the corner area including a plurality of extension areas each extending in a direction away from the central area, and including distal portions spaced apart from each other; a plurality of display elements arranged on a front surface of the substrate and arranged in the central area and the plurality of extension areas; and a first organic filler between adjacent extension areas among the plurality of extension areas. At least a portion of the first organic filler is between distal portions of the adjacent extension areas, and the adjacent extension areas and the first organic filler are disposed at a curved surface of the substrate that is different from a surface of the central area of the substrate.

In an embodiment, the plurality of display elements may include first display elements arranged in each of the plurality of extension areas, and the display device may further include a plurality of organic patterns disposed on the substrate and surrounding the first display elements disposed in the each of the plurality of extension areas.

In an embodiment, a first portion of the first organic filler may be between the adjacent extension areas of the substrate, and a second portion of the first organic filler may be between an organic pattern disposed in a first extension area, which is one of the adjacent extension areas, and an organic pattern disposed in a second extension area, which is another one of the adjacent extension areas.

In an embodiment, the first organic filler may include polymer.

In an embodiment, the display device may further include an encapsulation layer covering the plurality of display elements and including at least one inorganic encapsulation layer and at least one organic encapsulation layer. The at least one organic encapsulation layer may include a first organic encapsulation area covering a first display element disposed in a first extension area, which is one of the adjacent extension areas, and a second organic encapsulation area covering a first display element disposed in a second extension area, which is another one of the adjacent extension areas, and the first organic encapsulation area and the second organic encapsulation area may be spaced apart from each other with the first organic filler therebetween.

In an embodiment, the display device may further include a light-transmissive organic material layer on the encapsulation layer. The light-transmissive organic material layer may overlap the first organic encapsulation area, the first organic filler, and the second organic encapsulation area.

In an embodiment, the display device may further include a cover window on the light-transmissive organic material layer. A corner area of the cover window may have a curvature and may overlap the adjacent extension areas and the first organic filler.

In an embodiment, the display device may further include a lower protection film disposed on a rear surface of the substrate.

In an embodiment, the first organic filler may be in direct contact with a portion of an upper surface of the lower protection film.

In an embodiment, the corner area may further include a first adjacent corner area adjacent to one outermost extension area among the plurality of extension areas, a distal portion of the one outermost extension area and a distal portion of the first adjacent corner area may be physically connected to each other by a second organic filler between the one outermost extension area and the first adjacent corner area, and may be spatially spaced apart from each other with the second organic filler therebetween, and the first organic filler and the second organic filler may include a same material as each other.

In an embodiment of the disclosure, a method of manufacturing a display device includes preparing a substrate including a central area and a corner area, forming a plurality of display elements on the substrate so that the plurality of display elements are in the central area and the corner area, forming a cutout pattern between adjacent extension areas of a plurality of extension areas in the corner area of the substrate so that the plurality of extension areas includes distal portions spaced apart from each other, forming a lower protection film on a rear surface of the substrate, forming a first organic filler in an area corresponding to the cutout pattern, and bending the corner area of the substrate. The first organic filler is between distal portions of the adjacent extension areas, and the adjacent extension areas and the first organic filler are disposed on a curved surface of the substrate that is different from a surface of the substrate on which the central area is disposed.

In an embodiment, the plurality of display elements may include first display elements arranged in each of the plurality of extension areas, and the method may further include forming a plurality of organic patterns surrounding the first display elements disposed in the each of the plurality of extension areas.

In an embodiment, a first portion of the first organic filler may be between the adjacent extension areas of the substrate, and a second portion of the first organic filler may be between an organic pattern disposed in a first extension area, which is one of the adjacent extension areas, and an organic pattern disposed in a second extension area, which is another one of the adjacent extension areas.

In an embodiment, the forming of the first organic filler may include applying a curable shrinkage material to the area corresponding to the cutout pattern by inkjet, and forming the first organic filler by curing the curable shrinkage material using heat or light.

In an embodiment, the method may further include forming an encapsulation layer on the plurality of display elements, the encapsulation layer including at least one inorganic encapsulation layer and at least one organic encapsulation layer. The at least one organic encapsulation layer may include a first organic encapsulation area covering a first display element disposed in a first extension area, which is one of the adjacent extension areas, and a second organic encapsulation area covering a first display element disposed in a second extension area, which is another one of the adjacent extension areas, and the first organic encapsulation area and the second organic encapsulation area may be spaced apart from each other with the first organic filler therebetween.

In an embodiment, the method may further include forming a light-transmissive organic material layer on the encapsulation layer. The light-transmissive organic material layer may overlap the first organic encapsulation area, the first organic filler, and the second organic encapsulation area.

In an embodiment, the method may further include forming a cover window on the light-transmissive organic material layer. A corner area of the cover window may be bent to have a curvature and may overlap the adjacent extension areas and the first organic filler.

BRIEF DESCRIPTION OF THE DRAWINGS

The above and other features and advantages of illustrative embodiments of the disclosure will be more apparent from the following description taken in conjunction with the accompanying drawings, in which:

FIG. 10A is a schematic cross-sectional view of the display panel taken along line G-G' of FIG. 9;

FIGS. 12A to 12I are cross-sectional views illustrating an embodiment of a method of manufacturing a display device.

DETAILED DESCRIPTION

Figure 1:
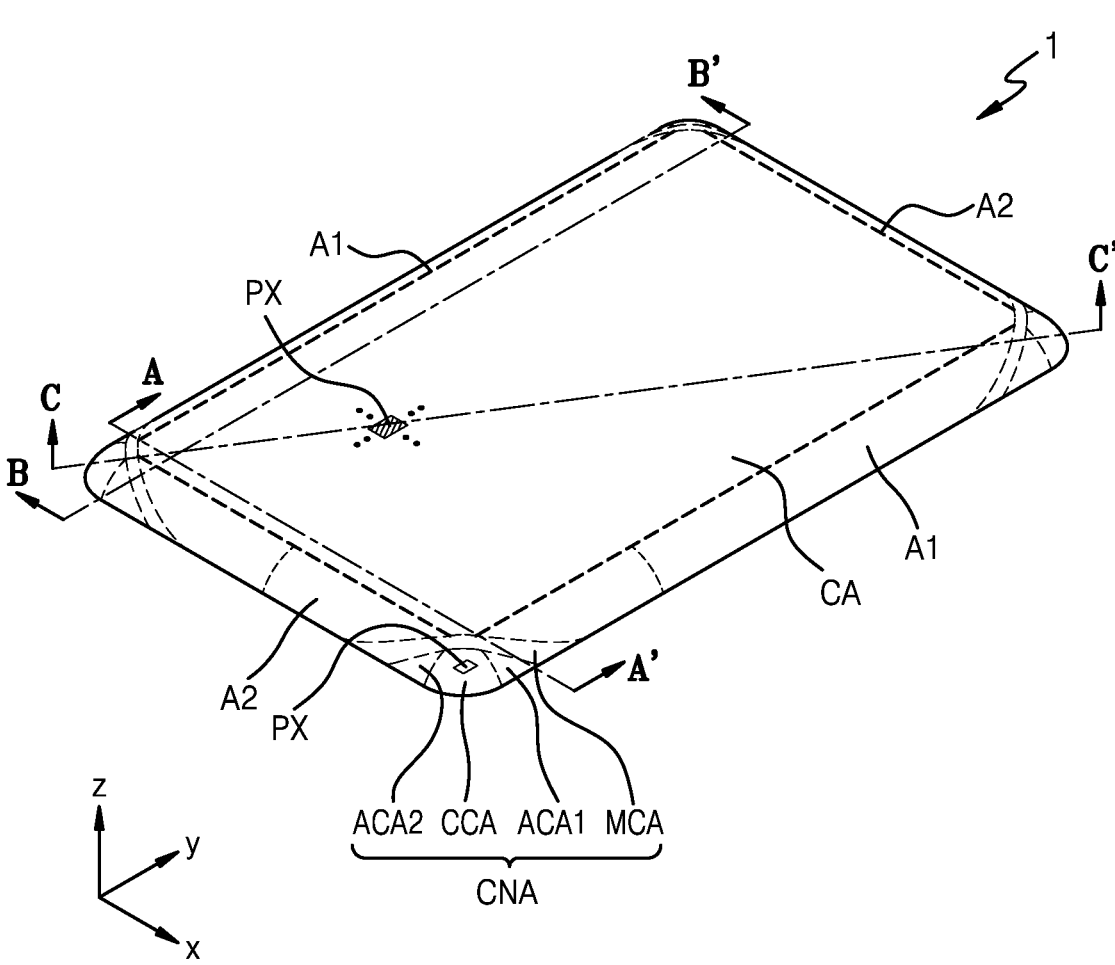
FIG. 1 is a perspective view schematically illustrating an embodiment of a display device.

Reference will now be made in detail to embodiments, examples of which are illustrated in the accompanying drawings, where like reference numerals refer to like elements throughout. In this regard, the illustrative embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the description allows for various changes and numerous embodiments, illustrative embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

When an embodiment may be implemented differently, a predetermined process order may be performed differently from the described order. For example, two consecutively described processes may be performed substantially at the same time or performed in an order opposite to the described order.

It will be further understood that, when layers, regions, or components are referred to as being connected to each other, they may be directly connected to each other or indirectly connected to each other with intervening layers, regions, or components therebetween. For example, when layers, regions, or elements are referred to as being electrically connected to each other, they may be directly electrically connected to each other or indirectly electrically connected to each other with intervening layers, regions, or elements therebetween.

Figure 2A:
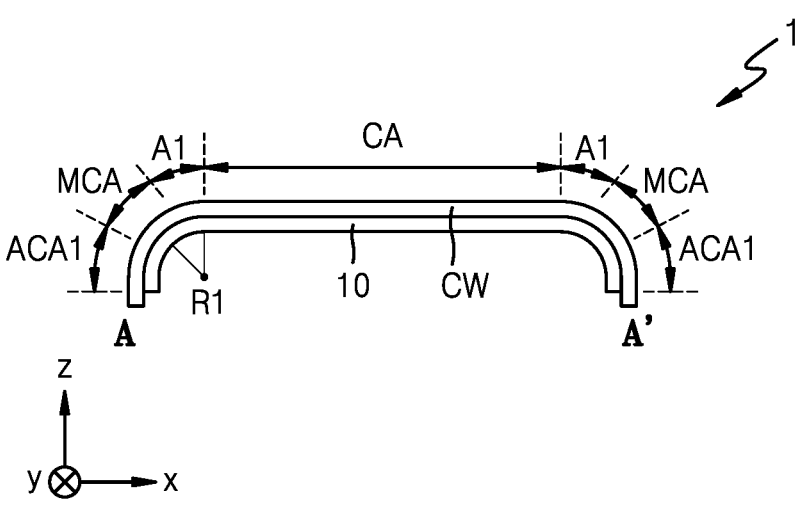
FIG. 2A is a cross-sectional view of an embodiment of the display device taken along line A-A' of FIG. 1.
Figure 2B:
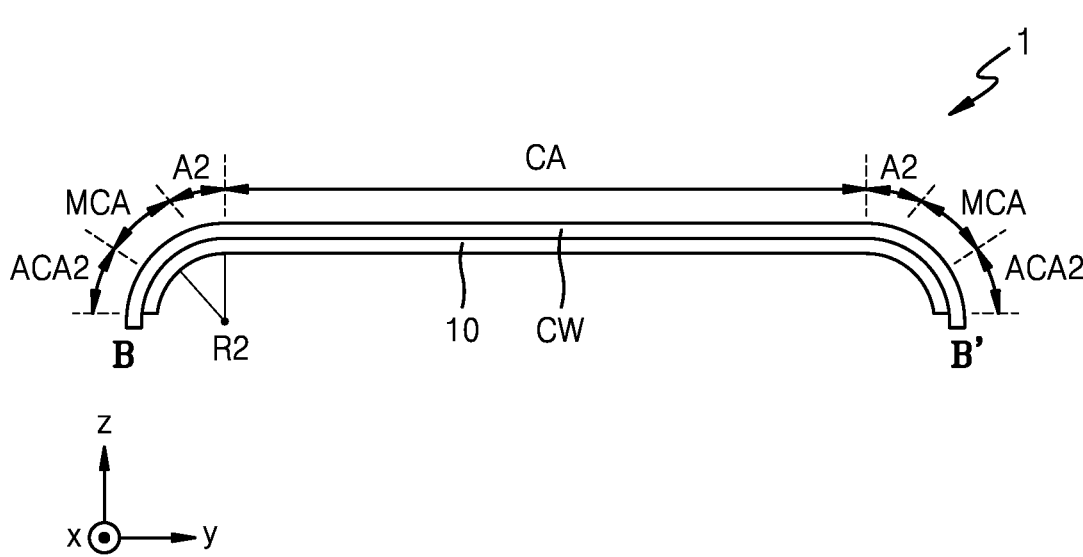
FIG. 2B is a cross-sectional view of an embodiment of the display device taken along line B-B' of FIG. 1.
Figure 2C:
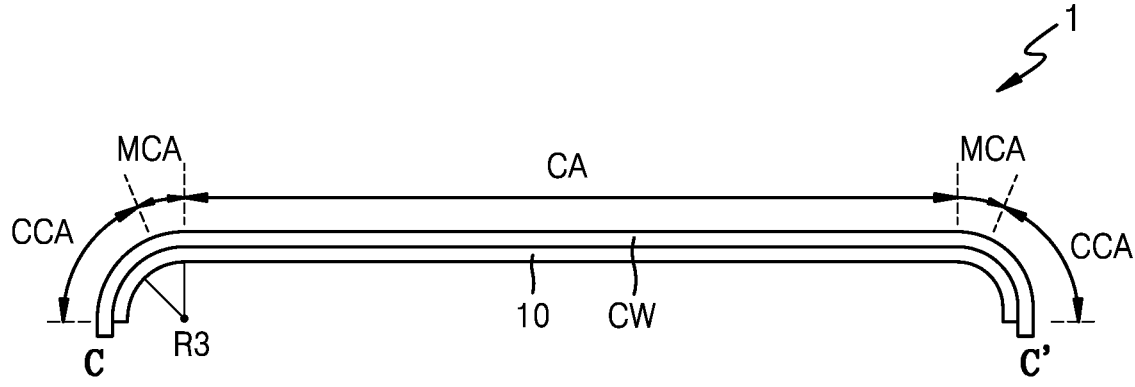
FIG. 2C is a cross-sectional view of an embodiment of the display device taken along line C-C' of FIG. 1.

FIG. 1 is a perspective view schematically illustrating an embodiment of a display device 1. FIG. 2A is a cross-sectional view of an embodiment of the display device 1 taken along line A-A' of FIG. 1, FIG. 2B is a cross-sectional view of an embodiment of the display device 1 taken along line B-B' of FIG. 1, and FIG. 2C is a cross-sectional view of the display device 1 taken along line C-C' of FIG. 1.

Referring to FIG. 1, the display device 1 in an embodiment display a moving image or a still image. The display device 1 in an embodiment may include portable electronic devices, such as mobile phones, smartphones, tablet personal computers, mobile communication terminals, electronic organizers, e-books, portable multimedia players ("PMPs"), navigations, and ultra-mobile personal computers ("UMPCs"). The display device 1 in an embodiment may include various electronic devices, such as televisions, laptops, monitors, billboards, and Internet of things ("IoT") devices. The display device 1 in an embodiment may be used in wearable devices, such as smart watches, watch phones, glass-type displays, and head mounted displays ("HMDs"). Also, the display device 1 in an embodiment may be used in dashboards of automobiles, center information displays ("CIDs") on the center fascia or dashboards of automobiles, room mirror displays replacing side mirrors of automobiles, and electronic devices on the rear sides of front seats to serve as entertainment devices for backseat passengers of automobiles.

The display device 1 may include an edge in a first direction and an edge in a second direction. The first direction and the second direction may cross each other. In an embodiment, the first direction and the second direction may form an acute angle, for example. In another embodiment, the first direction and the second direction may form an obtuse angle or may be orthogonal to each other. Hereinafter, a case where the first direction and the second direction are orthogonal to each other will be described in detail. In an embodiment, the first direction may be the x direction or the −x direction, and the second direction may be the y direction or the −y direction, for example.

In an embodiment, a corner in which the edge in the first direction (e.g., the x direction or the −x direction) meets the edge in the second direction (e.g., the y direction or the −y direction) may have a predetermined curvature.

As illustrated in FIGS. 2A to 2C, the display device 1 may include a cover window CW and a display panel 10. The cover window CW may protect the display panel 10. In an embodiment, the cover window CW may be disposed on the display panel 10. In an embodiment, the cover window CW may be a flexible window. The cover window CW may protect the display panel 10 because the cover window CW is easily bent according to an external force, without generating cracks. The cover window CW may include glass, sapphire, or plastic. The cover window CW may include ultra-thin glass ("UTG") or colorless polyimide ("CPI"), for example. In an embodiment, the cover window CW may have a structure in which a flexible polymer layer is disposed on one surface of a glass substrate, or may include only a polymer layer.

The display panel 10 may be disposed under the cover window CW. Although not illustrated in FIGS. 2A to 2C, the display panel 10 may be bonded to the cover window CW by a light-transmissive adhesive layer, such as an optically clear adhesive ("OCA") layer.

The display device 1 may display an image by the display panel 10. The display panel 10 may include pixels PX. The pixels PX may emit light to display an image. In an embodiment, the pixels PX may each include a red sub-pixel, a green sub-pixel, and a blue sub-pixel. In an alternative embodiment, the pixels PX may each include a red sub-pixel, a green sub-pixel, a blue sub-pixel, and a white sub-pixel.

The display device 1 may include a central area CA, a first area A1, a second area A2, and a corner area CNA. The pixel PX may be disposed in at least one of the central area CA, the first area A1, the second area A2, or the corner area CNA. In an embodiment, the pixels PX may be arranged in the central area CA, the first area A1, the second area A2, and the corner area CNA. In this case, the display device 1 may display an image in the central area CA, the first area A1, the second area A2, and the corner area CNA. In other words, each of the central area CA, the first area A1, the second area A2, and the corner area CNA may correspond to an image area through which an image is provided.

The central area CA may be a flat area. In an embodiment, the central area CA of the display device 1 may provide most of the image. The central area CA may be a flat surface. In this case, the central area CA may provide a flat image surface.

The first area A1 may be disposed along one side of the central area CA. In an embodiment, FIG. 1 illustrates a pair of first areas A1 respectively arranged on opposite sides of the central area CA along a long side of the central area CA. The first area A1 may be bent and extend from the central area CA in the first direction (e.g., the x direction or the −x direction). The first area A1 may be defined as an area bent from the central area CA in the cross-section (e.g., the xz cross-section) in the first direction (e.g., the x direction or the −x direction). As such, the first area A1 may provide a curved surface. The pixels PX may be arranged in the first area A1. In this case, the first area A1 may provide a round image surface.

The second area A2 may be disposed along the other side of the central area CA. In an embodiment, FIG. 1 illustrates a pair of second areas A2 respectively arranged on opposite sides of the central area CA along a short side of the central area CA. The second area A2 may be bent and extend from the central area CA in the second direction (e.g., the y direction or the −y direction). The second area A2 may be defined as an area bent from the central area CA in the cross-section (e.g., the yz cross-section) in the second direction (e.g., the y direction or the −y direction). As such, the second area A2 may have a curved surface. The pixels PX may be arranged in the second area A2. In this case, the second area A2 may provide a round image surface.

The corner area CNA may be an area at a corner of the display device 1. In an embodiment, the corner area CNA may be an area in which the edge of the display device 1 in the first direction (e.g., the x direction or the −x direction) meets the edge of the display device 1 in the second direction (e.g., the y direction or the −y direction). In other words, the corner area CNA may be between the first area A1 and the second area A2 of the display device 1.

The corner area CNA may be adjacent to the central area CA, the first area A1, and the second area A2. When the first area A1 is bent and extends in the first direction (e.g., the x direction or the −x direction) and the second area A2 is bent and extends in the second direction (e.g., the y direction or the −y direction), at least a portion of the corner area CNA may be bent and extend in the first direction (e.g., the x direction or the −x direction) and may be bent and extend in the second direction (e.g., the y direction or the −y direction). The corner area CNA may include a central corner area CCA, a first adjacent corner area ACA1, a second adjacent corner area ACA2, and a middle corner area MCA.

The central corner area CCA may be bent and extend in the first direction (e.g., the x direction or the −x direction) and may be bent and extend in the second direction (e.g., the y direction or the −y direction). The central corner area CCA may be bent in the cross-section (e.g., the xz cross-section) in the first direction (e.g., the x direction or the −x direction). The central corner area CCA may be bent in the cross-section (e.g., the yz cross-section) in the second direction (e.g., they direction or the −y direction). The central corner area CCA may be curved areas in which curvatures in a plurality of directions overlap each other.

A first adjacent corner area ACA1 and a second adjacent corner area ACA2 may be on opposite sides of the central corner area CCA.

The first adjacent corner area ACA1 may be adjacent to one side of the central corner area CCA. In an embodiment, the first adjacent corner area ACA1 may be between the central corner area CCA and the first area A1. A portion of the first area A1 may be between the central area CA and the first adjacent corner area ACA1 in the first direction (e.g., the x direction or the −x direction). The first adjacent corner area ACA1 may be bent and extend in the first direction (e.g., the x direction or the −x direction). The first adjacent corner area ACA1 may be defined as the corner area CNA bent in the cross-section (e.g., the xz cross-section in FIG. 2A) in the first direction (e.g., the x direction or the −x direction). In an embodiment, a portion of the first area A1 and the first adjacent corner area ACA1 may be arranged and bent in the first direction (e.g., the x direction or the −x direction).

The second adjacent corner area ACA2 may be adjacent to the other side of the central corner area CCA. In an embodiment, the second adjacent corner area ACA2 may be between the central corner area CCA and the second area A2. A portion of the second area A2 may be between the central area CA and the second adjacent corner area ACA2 in the second direction (e.g., the y direction or the −y direction). The second adjacent corner area ACA2 may be bent and extend in the second direction (e.g., the y direction or the −y direction). The second adjacent corner area ACA2 may be defined as the corner area CNA bent in the cross-section (e.g., the yz cross-section in FIG. 2B) in the second direction (e.g., the y direction or the −y direction). In an embodiment, a portion of the second area A2 and the second adjacent corner area ACA2 may be arranged and bent in the second direction (e.g., the y direction or the −y direction).

The middle corner area MCA may be between the central area CA and the central corner area CCA. In an embodiment, the middle corner area MCA may extend between the first area A1 and the first adjacent corner area ACA1. In an embodiment, the middle corner area MCA may extend between the second area A2 and the second adjacent corner area ACA2. A driving circuit which provides an electrical signal to the pixel PX and/or a power line which supplies power to the pixel PX may be arranged in the middle corner area MCA. In this case, the pixel PX disposed in the middle corner area MCA may overlap the driving circuit and/or the power line. In an embodiment, the middle corner area MCA may be omitted.

Referring to FIG. 2A, the first area A1, the middle corner area MCA, and the first adjacent corner area ACA1 may be bent with a first radius R1 of curvature. Referring to FIG. 2B, the second area A2, the middle corner area MCA, and the second adjacent corner area ACA2 may be bent with a second radius R2 of curvature. The first radius R1 of curvature may be equal to or different from the second radius R2 of curvature. Referring to FIG. 2C, the middle corner area MCA and the central corner area CCA may be bent with a third radius R3 of curvature.

In the display device 1, the pixels PX may be arranged in not only the central area CA but also the first area A1, the second area A2, and the corner area CNA to display an image. Therefore, the proportion of the display area that displays an image in the display device 1 may increase. Also, because the display device 1 displays an image while the corner of the display device 1 is bent, aesthetic sense may be improved.

Figure 3:
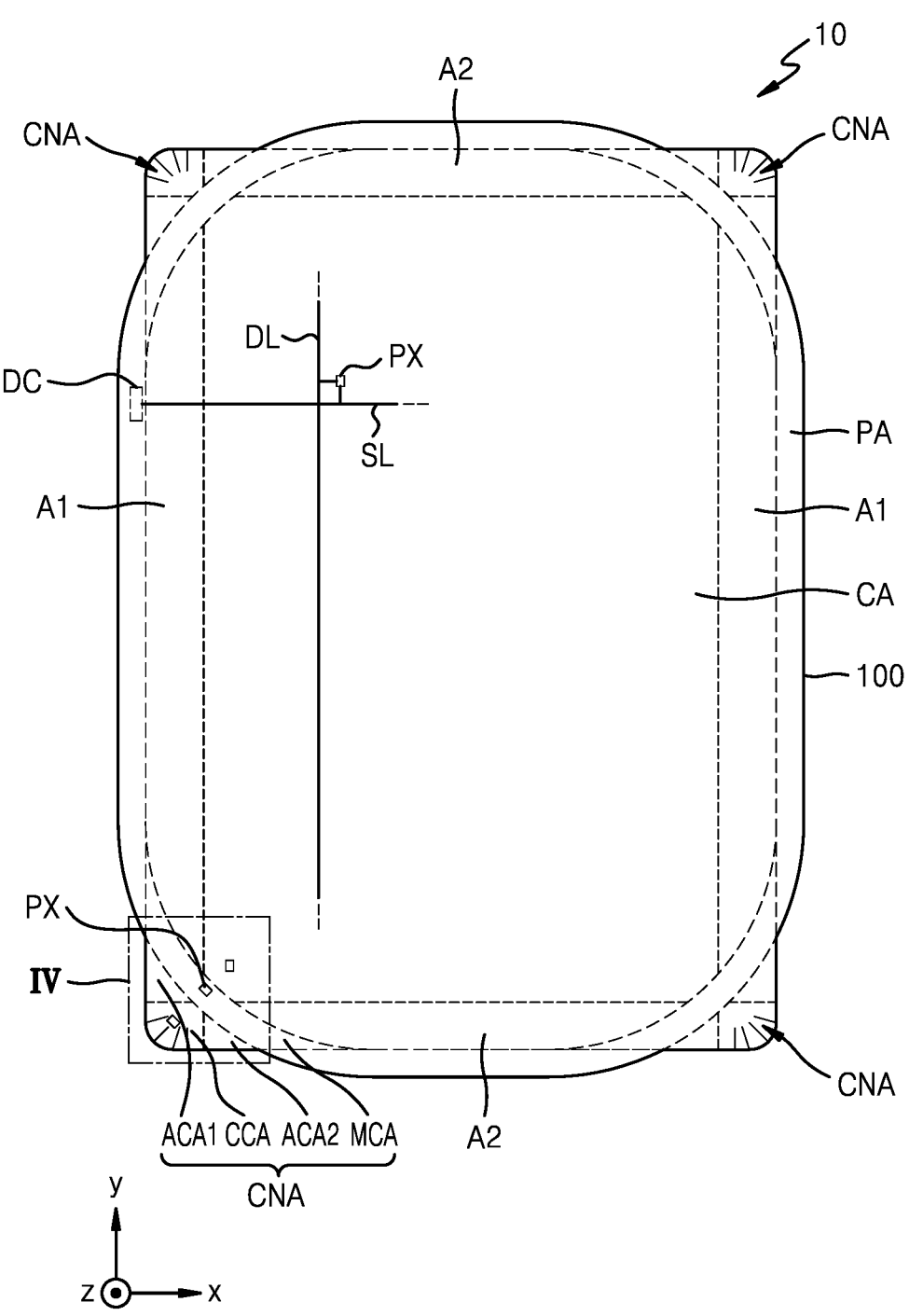
FIG. 3 is a plan view schematically illustrating an embodiment of a display panel.
Figure 4:
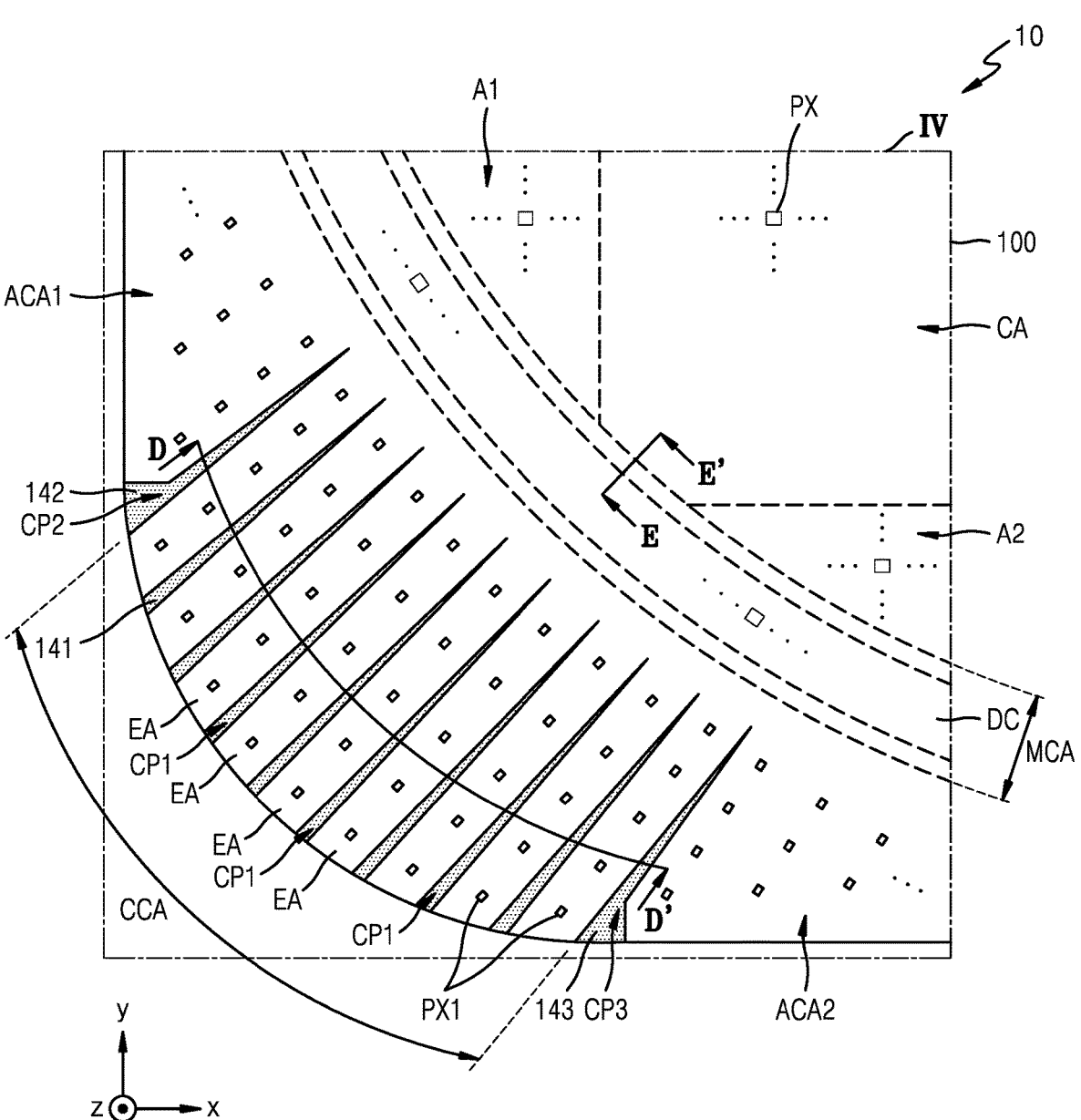
FIG. 4 is an enlarged view of an embodiment of portion IV of FIG. 3.
Figure 5:
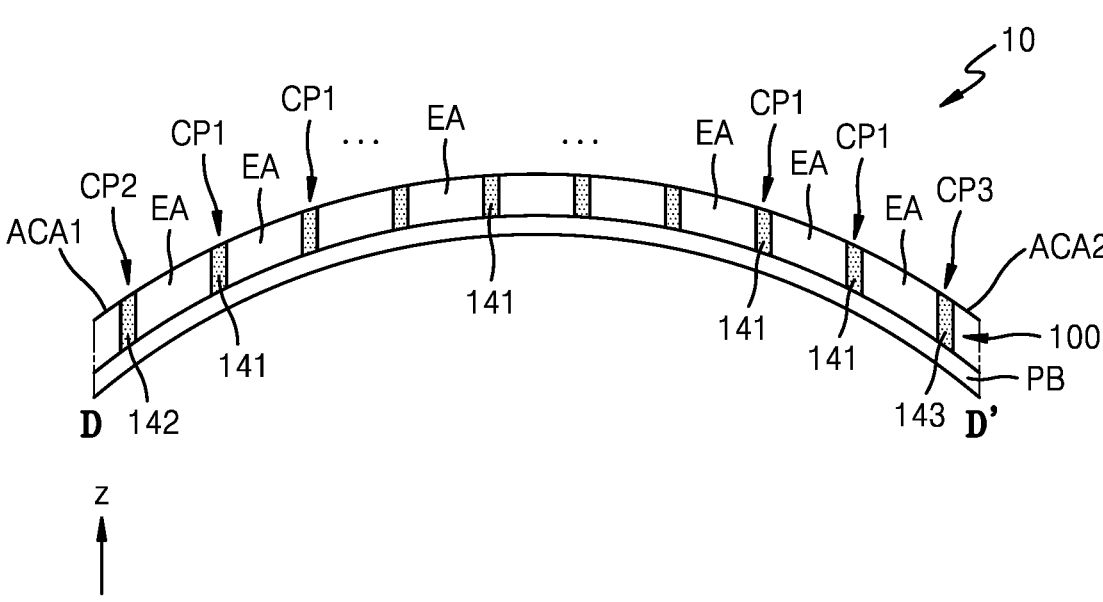
FIG. 5 schematically illustrates an embodiment of a cross-section of a corner area of the display panel.

FIG. 3 is a plan view schematically illustrating an embodiment of a display panel 10. For convenience of description, FIG. 3 illustrates a state in which the display panel 10 is unbent. FIG. 4 is an enlarged view of an embodiment of portion IV of FIG. 3. FIG. 5 schematically illustrates an embodiment of a cross-section of a corner area of the display panel 10. The shape of the display panel 10 illustrated in FIG. 3 may be substantially the same as the shape of the display device 1 described with reference to FIG. 1. In an embodiment, just like the display device 1 that includes the central area CA, the first area A1, the second area A2, and the corner area CNA, the display panel 10 may include a central area CA, a first area A1, a second area A2, and a corner area CNA, for example.

The display panel 10 may display an image through the central area CA, the first area A1, the second area A2, and the corner area CNA. The display panel 10 may include a substrate 100 and pixels PX disposed on the substrate 100. Because the pixels PX of the display panel 10 and the structures around the pixels PX are disposed on the substrate 100, the shape of the display panel 10 in FIG. 3 may be substantially the same as the shape of the substrate 100. In an embodiment, it may be stated that the substrate 100 includes the central area CA, the first area A1, the second area A2, and the corner area CNA, for example. The central area CA, the first area A1, the second area A2, and the corner area CNA of the substrate 100 are the same as described above with reference to FIGS. 1 to 2C. In an embodiment, the central area CA of the substrate 100 may occupy most of the display area, for example. The expression "the central area CA occupies most of the display area" may mean that the central area CA occupies about 50% or more of the display area. The first area A1 may extend from the central area CA in the first direction (e.g., the x direction or the −x direction), and the second area A2 may extend from the central area CA in the second direction (e.g., they direction or the −y direction). The first areas A1 may be on opposite sides (e.g., the long side) of the central area CA, and the second areas A2 may be on opposite sides (e.g., the short side) of the central area CA. As described above, the corner area CNA may be between the first area A1 and the second area A2, which cross each other, and the corner area CNA may include a central corner area CCA, a first adjacent corner area ACA1, a second adjacent corner area ACA2, and a middle corner area MCA.

The pixel PX may be disposed in at least one of the central area CA, the first area A1, the second area A2, or the corner area CNA. In an embodiment, the pixel PX may be disposed in each of the central area CA, the first area A1, the second area A2, and the corner area CNA. The pixel PX may include sub-pixels which emit pieces of light of different colors, as described above. The sub-pixels may each include a display element, such as a light-emitting diode. In an embodiment, the display element may be an organic light-emitting diode including an organic emission layer. In an alternative embodiment, the display element may be an inorganic light-emitting diode in which an emission layer includes an inorganic semiconductor. In an alternative embodiment, the display element may be a quantum dot light-emitting diode including a quantum dot emission layer.

A peripheral area PA may be a non-display area that does not provide an image. The peripheral areas PA may be respectively adjacent to the first areas A1 and the second areas A2. A driver which provides an electrical signal to the pixel PX and/or a power line which supplies power to the pixel PX may be arranged in the peripheral area PA. The middle corner area MCA may be between the peripheral area PA adjacent to the first area A1 and the peripheral area PA adjacent to the second area A2. When the peripheral areas PA and the middle corner areas MCA are connected, an imaginary closed loop may be formed in the plan view of FIG. 3.

A driving circuit may be disposed in the peripheral area PA and the middle corner area MCA. In this regard, FIG. 4 illustrates a portion of a driving circuit DC in the middle corner area MCA. A portion of the driving circuit DC of FIG. 4 may be a portion of a scan driver which provides a scan signal to the pixel PX or a portion of a data driver which provides a data signal to the pixel PX.

At least one of the first area A1, the second area A2, or corner area CNA of the substrate 100 may be bent. The first area A1 and the first adjacent corner area ACA1 may be bent in the cross-section (e.g., the xz cross-section) in the first direction (e.g., the x direction or the −x direction). The second area A2 and the second adjacent corner area ACA2 may be bent in the cross-section (e.g., the yz cross-section) in the second direction (e.g., the y direction or the −y direction). The central corner area CCA may be bent in the cross-section (e.g., the xz section) in the first direction (e.g., the x direction or the −x direction) and may be bent in the cross-section (e.g., the yz cross-section) in the second direction (e.g., the y direction or the −y direction).

When the central corner area CCA is bent, compressive strain may be greater than tensile strain in the central corner area CCA. In order to relieve stress of the central corner area CCA during transformation, the central corner area CCA may include first cutout patterns CP1, as illustrated in FIG. 4.

Referring to FIG. 4, the central corner area CCA of the substrate 100 may include extension areas EA in which distal portions (end portions) are separated or spaced apart from each other by the first cutout patterns CP1. The extension areas EA may extend in a direction away from the central area CA. The distal portions of the extension areas EA may be separated or spaced apart from the distal portions of the adjacent extension areas EA by the first cutout patterns CP1. Proximal portions of the extension areas EA may be physically connected to each other. In other words, the proximal portions of the extension areas EA may be integrally connected as a single body.

As illustrated in FIGS. 3 and 4, when the substrate 100 is in an unbent state, the first cutout pattern CP1 may approximately have a V-shape or U-shape. However, as the substrate 100 is bent in the process of manufacturing the display panel 10, the width of the first cutout pattern CP1 may be reduced. One of the outermost extension areas EA among the extension areas EA arranged in the central corner area CCA may be spaced apart from the first adjacent corner area ACA1 with a second cutout pattern CP2 therebetween, and the other one thereof may be spaced apart from the second adjacent corner area ACA2 with a third cutout pattern CP3 therebetween. As the substrate 100 is bent in the process of manufacturing the display panel 10, the widths of the second cutout pattern CP2 and the third cutout pattern CP3 may be reduced.

As the substrate 100 is bent, the width of the first cutout pattern CP1 may be reduced, and the interval between the adjacent extension areas EA may be reduced. In order to prevent the overlapping of the extension areas EA or the imbalance of the intervals between the extension areas EA due to the bending of the substrate 100 and maintain a constant interval between the extension areas EA, the display panel 10 may include a first organic filler 141 between the adjacent extension areas EA, as illustrated in FIGS. 4 and 5. Similarly, the display panel 10 may include a second organic filler 142 between the first adjacent corner area ACA1 and the extension area EA, which are adjacent to each other, and a third organic filler 143 between the second adjacent corner area ACA2 and the extension area EA, which are adjacent to each other. The first to third organic fillers 141, 142, and 143 may be spaced apart from each other.

The extension areas EA and the first organic filler 141 may be disposed at a surface (e.g., a curved surface) of the substrate 100 that is different from a surface (e.g., a flat surface) of the central area CA. In other words, a gap between the distal portions of the adjacent extension areas EA may be filled with the first organic filler 141. Similarly, the distal portion of the first adjacent corner area ACA1 and the distal portion of the extension area EA may be spatially apart from each other by the second organic filler 142, but may be physically connected to each other by the second organic filler 142. The distal portion of the second adjacent corner area ACA2 and the distal portion of the extension area EA may be spatially apart from each other by the third organic filler 143, but may be physically connected to each other by the third organic filler 143.

The extension areas EA and the first organic filler 141 may be disposed on a surface (e.g., a curved surface) of the substrate 100 that is different from a surface (e.g., a flat surface) of the substrate 100 on which the central area CA is disposed. In other words, the central area CA may form a flat surface, whereas the extension areas EA and the first organic filler 141 may form a curved surface. Similarly, the first adjacent corner area ACA1, the second adjacent corner area ACA2, the second organic filler 142, and the third organic filler 143 may also be disposed on the curved surface.

The first to third organic fillers 141, 142, and 143 may include the same material as each other. The first organic filler 141, the second organic filler 142, and the third organic filler 143 may include an organic material, e.g., a polymer. The organic material is a shrinkage material, and may include a photo-curable shrinkage material or a thermo-curable shrinkage material. After a lower protection film PB is disposed on the back surface of the substrate 100 in the process of manufacturing the display panel 10, a shrinkage material may be injected into the gap between the extension areas EA, the gap between the first adjacent corner area ACA1 and the extension area EA, and the gap between the second adjacent corner area ACA2 and the extension area EA. Thereafter, the display panel 10 may be manufactured by curing the shrinkage material. A photo-curable shrinkage material, which is injected into the gap, may be a monomer, such as 1,6-hexanediol diacrylate ("HDDA"), and may be cured into a polymer, for example. Other photo-curable shrinkage materials may include trimethylolpropane triacrylate ("TMPTA"), trimethylolpropane triacrylate including M (where M is a natural number greater than 0) moles of ethoxylation ("TMP(EO)$_M$TA"), pentaerythritol tetraacrylate ("PETA"), dipentaerythritol penta/hexa acrylate ("DPHA"), or the like. The lower protection film PB may include an organic material, such as polyethylene terephthalate ("PET") or polydimethylsiloxane ("PDMS").

Figure 6:
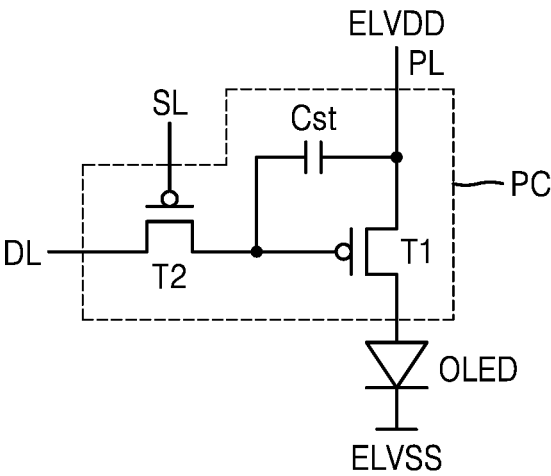
FIG. 6 is an equivalent circuit diagram schematically illustrating an embodiment of a light-emitting diode corresponding to a sub-pixel of a display panel and a sub-pixel circuit electrically connected to the light-emitting diode.

FIG. 6 is an equivalent circuit diagram schematically illustrating an embodiment of a light-emitting diode OLED corresponding to a sub-pixel of a display panel and a sub-pixel circuit PC electrically connected to the light-emitting diode OLED. In FIG. 6, it is assumed that the light-emitting diode as the display element is an organic light-emitting diode OLED.

Referring to FIG. 6, the sub-pixel circuit PC may include a driving thin-film transistor T1, a switching thin-film transistor T2, and a storage capacitor Cst. In an embodiment, the organic light-emitting diode OLED may emit red light, green light, or blue light, or may emit red light, green light, blue light, or white light.

The switching thin-film transistor T2 may be connected to a scan line SL and a data line DL, and may transmit, to the driving thin-film transistor T1, a data signal or a data voltage input from the data line DL, in response to a scan signal or a switching voltage input from the scan line SL. The storage capacitor Cst may be connected to the switching thin-film transistor T2 and a driving voltage line PL, and may store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may control a driving current flowing from the driving voltage line PL to the organic light-emitting diode OLED according to a voltage value stored in the storage capacitor Cst. The organic light-emitting diode OLED may emit light having a predetermined luminance according to the driving current. An opposite electrode of the organic light-emitting diode OLED may receive a second power supply voltage ELVSS.

Although FIG. 6 illustrates that the sub-pixel circuit PC includes two thin-film transistors and one storage capacitor, the sub-pixel circuit PC may include three or more thin-film transistors or two or more capacitors.

Figure 7:
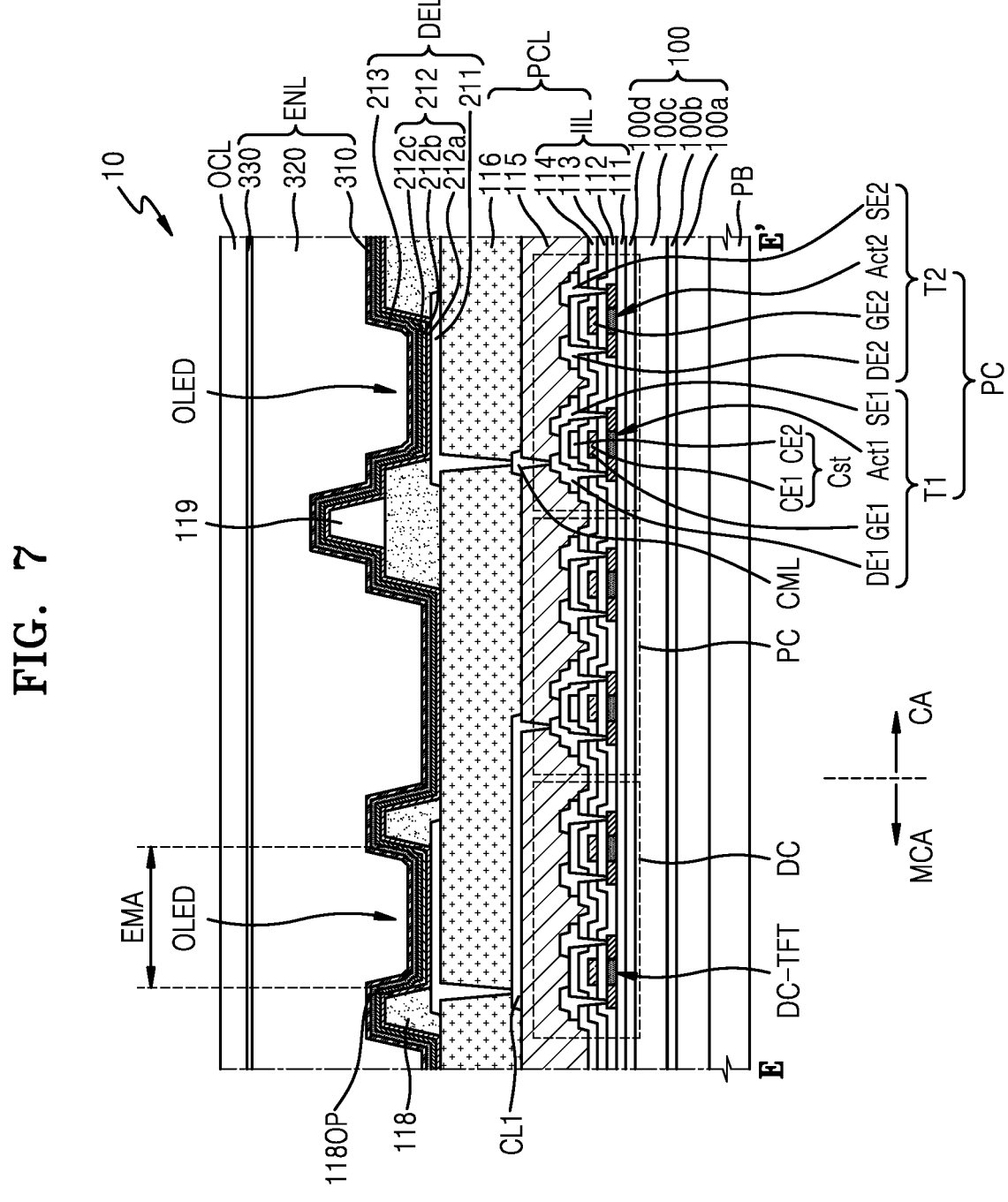
FIG. 7 is a schematic cross-sectional view of an embodiment of the display panel 10 taken along line E-E' of FIG. 4.

FIG. 7 is a schematic cross-sectional view of an embodiment of the display panel 10 taken along line E-E' of FIG. 4.

Referring to FIG. 7, the display panel 10 may include a substrate 100, a pixel circuit layer PCL, a display element layer DEL, an encapsulation layer ENL, and a light-transmissive organic material layer OCL.

In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked in this stated order. In another embodiment, the substrate 100 may include glass.

At least one of the first base layer 100a or the second base layer 100c may include polymer resin, such as polyethersulfone, polyarylate, polyetherimide, polyethylene naphthalate, PET, polyphenylene sulfide, polyimide, polycarbonate, cellulose triacetate, or cellulose acetate propionate.

The first barrier layer 100b and the second barrier layer 100d are barrier layers that prevent infiltration of foreign matter, and may include a single layer or layers including an inorganic material, such as silicon nitride, silicon oxide, and/or silicon oxynitride.

A lower protection film PB may be disposed on the rear surface of the substrate 100. The lower protection film PB may include an organic material, such as PET or PDMS.

The pixel circuit layer PCL may be disposed on the substrate 100. The pixel circuit layer PCL may include a driving circuit DC and a sub-pixel circuit PC. In an embodiment, a portion of the driving circuit DC may be disposed in a middle corner area MCA. The driving circuit DC may include a driving circuit thin-film transistor DC-TFT. In an embodiment, the driving circuit DC may be connected to a scan line. The sub-pixel circuit PC may include at least one thin-film transistor. In an embodiment, the sub-pixel circuit PC may include a driving thin-film transistor T1, a switching thin-film transistor T2, and a storage capacitor Cst.

In the middle corner area MCA, an organic light-emitting diode OLED as a display element may overlap the driving circuit DC. The organic light-emitting diode OLED disposed in the middle corner area MCA may be electrically connected to the sub-pixel circuit PC disposed in a central area CA. In this regard, FIG. 7 illustrates that the organic light-emitting diode OLED in the middle corner area MCA and the sub-pixel circuit PC in the central area CA are electrically connected to each other through a first connection line CL1.

The pixel circuit layer PCL may include an inorganic insulating layer IIL, a lower organic insulating layer 115, and an organic insulating layer 116, which are disposed below or/and above the elements of the driving thin-film transistor T1. The inorganic insulating layer IIL may include a buffer layer 111, a first gate insulating layer 112, a second gate insulating layer 113, and an inter-insulating layer 114. The driving thin-film transistor T1 may include a first semiconductor layer Act1, a first gate electrode GE1, a first source electrode SE1, and a first drain electrode DE1.

The buffer layer 111 may be disposed on the substrate 100. The buffer layer 111 may include an inorganic insulating material, such as silicon nitride (SiN$_x$), silicon oxynitride (SiON), and silicon oxide (SiO$_2$), and may include a single layer or layers including the inorganic insulating material described above.

The first semiconductor layer Act1 may be disposed on the buffer layer 111. The first semiconductor layer Act1 may include polysilicon. In an alternative embodiment, the first semiconductor layer Act1 may include amorphous silicon, an oxide semiconductor, or an organic semiconductor. The first semiconductor layer Act1 may include a channel region, and a drain region and a source region respectively on opposite sides of the channel region.

The first gate electrode GE1 may overlap the channel region. The first gate electrode GE1 may include a low-resistance metal material. The first gate electrode GE1 may include a conductive material including molybdenum (Mo), aluminum (Al), copper (Cu), titanium (Ti), or the like, and may include a single layer or layers including the conductive material described above.

The first gate insulating layer 112 between the first semiconductor layer Act1 and the first gate electrode GE1 may include an inorganic insulating material, such as silicon oxide ($SiO_2$), silicon nitride, silicon oxynitride, aluminum oxide, titanium oxide, tantalum oxide, hafnium oxide, and/or zinc oxide ($ZnO_x$, such as ZnO or $ZnO_2$).

The second gate insulating layer 113 may cover the first gate electrode GE1. Similar to the first gate insulating layer 112, the second gate insulating layer 113 may include an inorganic insulating material, such as silicon oxide ($SiO_2$), silicon nitride, silicon oxynitride, aluminum oxide, titanium oxide, tantalum oxide, hafnium oxide, and/or zinc oxide ($ZnO_x$, such as ZnO or $ZnO_2$).

An upper electrode CE2 of the storage capacitor Cst may be disposed on the second gate insulating layer 113. The upper electrode CE2 may overlap the first gate electrode GE1 therebelow. In this case, the first gate electrode GE1 of the driving thin-film transistor T1 and the upper electrode CE2, which overlap each other with the second gate insulating layer 113 therebetween, may constitute the storage capacitor Cst. That is, the first gate electrode GE1 of the driving thin-film transistor T1 may function as a lower electrode CE1 of the storage capacitor Cst.

As described above, the storage capacitor Cst and the driving thin-film transistor T1 may overlap each other. In some embodiments, the storage capacitor Cst may not overlap the driving thin-film transistor T1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or layers including the material described above.

The inter-insulating layer 114 may cover the upper electrode CE2. The inter-insulating layer 114 may include silicon oxide, silicon nitride, silicon oxynitride, aluminum oxide, titanium oxide, tantalum oxide, hafnium oxide, or zinc oxide ($ZnO_x$, such as ZnO or $ZnO_2$). The inter-insulating layer 114 may include a single layer or layers including the inorganic insulating material described above.

The first drain electrode DE1 and the first source electrode SE1 may be disposed on the inter-insulating layer 114. The first drain electrode DE1 and the first source electrode SE1 may include a material having good conductivity. The first drain electrode DE1 and the first source electrode SE1 may include a conductive material including molybdenum (Mo), aluminum (Al), copper (Cu), titanium (Ti), or the like, and may include a single layer or layers including the conductive material described above. In an embodiment, the first drain electrode DE1 and the first source electrode SE1 may have a multilayer structure of Ti/Al/Ti.

The switching thin-film transistor T2 may include a second semiconductor layer Act2, a second gate electrode GE2, a second drain electrode DE2, and a second source electrode SE2. Because the second semiconductor layer Act2, the second gate electrode GE2, the second drain electrode DE2, and the second source electrode SE2 are respectively similar to the first semiconductor layer Act1, the first gate electrode GE1, the first drain electrode DE1, and the first source electrode SE1, detailed descriptions thereof are omitted.

Similar to the switching thin-film transistor T2, the driving circuit thin-film transistor DC-TFT may include a driving circuit semiconductor layer, a driving circuit gate electrode, a driving circuit source electrode, and a driving circuit drain electrode.

The lower organic insulating layer 115 may be disposed on at least one thin-film transistor. In an embodiment, the lower organic insulating layer 115 may be disposed to cover the first drain electrode DE1 and the first source electrode SE1. The lower organic insulating layer 115 may include an organic material. In an embodiment, the lower organic insulating layer 115 may include an organic material selected from general-purpose polymer, such as polymethylmethacrylate ("PMMA") or polystyrene ("PS"), polymer derivatives having a phenolic group, acrylic polymer, imide-based polymer, aryl ether-based polymer, amide-based polymer, fluorine-based polymer, p-xylene-based polymer, vinyl alcohol-based polymer, and any combination thereof, for example.

A connection electrode CML and the first connection line CL1 may be disposed on the lower organic insulating layer 115. In this case, the connection electrode CML and the first connection line CL1 may be connected to the first drain electrode DE1 or the first source electrode SE1 through a contact hole of the lower organic insulating layer 115. The connection electrode CML and the first connection line CL1 may include a material having good conductivity. The connection electrode CML and the first connection line CL1 may include a conductive material including molybdenum (Mo), aluminum (Al), copper (Cu), titanium (Ti), or the like, and may include a single layer or layers including the conductive material described above. In an embodiment, the connection electrode CML and the first connection line CL1 may have a multilayer structure of Ti/Al/Ti.

As illustrated in FIG. 7, the first connection line CL1 may extend from the central area CA to the middle corner area MCA and may overlap the driving circuit DC. In another embodiment, the first connection line CL1 may extend from the peripheral area (refer to PA of FIG. 3) or the corner area (refer to CNA of FIG. 3) to the middle corner area MCA. In another embodiment, the first connection line CL1 may extend from the first area (refer to A1 of FIG. 3) and/or the second area (refer to A2 of FIG. 3) to the middle corner area MCA. The first connection line CL1 may overlap the driving circuit thin-film transistor DC-TFT.

The organic insulating layer 116 may be disposed to cover the connection electrode CML and the first connection line CL1. The organic insulating layer 116 may include an organic material. The organic insulating layer 116 may include an organic insulating material selected from general-purpose polymer, such as PMMA or PS, polymer derivatives having a phenolic group, acrylic polymer, imide-based polymer, aryl ether-based polymer, amide-based polymer, fluorine-based polymer, p-xylene-based polymer, vinyl alcohol-based polymer, and any combination thereof.

The display element layer DEL may be disposed on the pixel circuit layer PCL. The display element layer DEL may include organic light-emitting diodes OLED as a display element. At least one of the organic light-emitting diodes OLED may be arranged in the central area CA. Another one of the organic light-emitting diodes OLED may be disposed in the middle corner area MCA. Accordingly, in the illustrated embodiment, the display panel 10 may display an image even in the middle corner area MCA in which the driving circuit DC is disposed.

The organic light-emitting diode OLED, which is disposed in the central area CA, may be electrically connected to the connection electrode CML through a contact hole of the organic insulating layer 116. The organic light-emitting diode OLED, which is disposed in the middle corner area MCA, may be electrically connected to the first connection line CL1 through a contact hole of the organic insulating layer 116. The organic light-emitting diode OLED may include a first electrode 211, an intermediate layer 212, and a second electrode 213.

The first electrode 211 may be electrically connected to the connection electrode CML or the first connection line CL1 through a contact hole of the organic insulating layer 116. The first electrode 211 may include a conductive oxide, such as indium tin oxide ("ITO"), indium zinc oxide ("IZO"), zinc oxide (ZnO), indium oxide (In$_2$O$_3$), indium gallium oxide ("IGO"), or aluminum zinc oxide ("AZO"). In another embodiment, the first electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any combination thereof. In another embodiment, the first electrode 211 may further include a layer including ITO, IZO, ZnO, or In$_2$O$_3$ above and/or below the reflective layer.

A bank layer 118 having an opening 118OP exposing the central portion of the first electrode 211 may be disposed on the first electrode 211. The bank layer 118 may include an organic insulating material and/or an inorganic insulating material. The opening 118OP may define an emission area for light emitted from the organic light-emitting diode OLED (hereinafter referred to as an emission area EMA). In an embodiment, the width of the opening 118OP may correspond to the width of the emission area EMA, for example. Also, the width of the opening 118OP may correspond to the width of the sub-pixel.

A spacer 119 may be disposed on the bank layer 118. The spacer 119 may include an organic material, such as poly-imide. In an alternative embodiment, the spacer 119 may include an inorganic insulating material, such as silicon nitride or silicon oxide, or may include an organic insulating material and an inorganic insulating material.

In an embodiment, the spacer 119 may include a material that is different from a material of the bank layer 118. In an embodiment, the bank layer 118 may include a light-blocking material and the spacer 119 may include a light trans-missive material. In another embodiment, the spacer 119 may include the same material as the material of the bank layer 118, for example. In this case, the bank layer 118 and the spacer 119 may be formed together in a mask process using a halftone mask or the like.

The intermediate layer 212 may be disposed on the bank layer 118. The intermediate layer 212 may include an emission layer 212b disposed in the opening 118OP of the bank layer 118. The emission layer 212b may include a high molecular weight organic material or a low molecular weight organic material that emits light of a predetermined color.

A first functional layer 212a and a second functional layer 212c may be disposed below and above the emission layer 212b, respectively. The first functional layer 212a may include a hole transport layer ("HTL"), or may include an HTL and a hole injection layer ("HIL"), for example. The second functional layer 212c is an element disposed on the emission layer 212b and may be optional. The second functional layer 212c may include an electron transport layer ("ETL") and/or an electron injection layer ("EIL"). The first functional layer 212a and/or the second functional layer 212c may be a common layer covering an entirety of the substrate 100, like the second electrode 213 to be described below.

The second electrode 213 may be disposed on the inter-mediate layer 212. The second electrode 213 may include a conductive material having a low work function. In an embodiment, the second electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof, for example. In an alternative embodiment, the second electrode 213 may further include a layer including ITO, IZO, ZnO, or In$_2$O$_3$ on the (semi)transparent layer including the material described above.

In some embodiments, a capping layer (not illustrated) may be further disposed on the second electrode 213. The capping layer may include an inorganic material such as LiF, and/or an organic material.

The encapsulation layer ENL may be disposed on the second electrode 213. In an embodiment, the encapsulation layer ENL may include at least one inorganic encapsulation layer and at least one organic encapsulation layer. In an embodiment, FIG. 7 illustrates that the encapsulation layer ENL includes a first inorganic encapsulation layer 310, an organic encapsulation layer 320, and a second inorganic encapsulation layer 330, which are sequentially stacked in this stated order.

The first inorganic encapsulation layer 310 and the second inorganic encapsulation layer 330 may include at least one inorganic material selected from aluminum oxide (Al$_2$O$_3$), titanium oxide (TiO$_2$), tantalum oxide (Ta$_2$O$_5$), hafnium oxide (HfO$_2$), zinc oxide (ZnO$_x$, such as ZnO or ZnO$_2$), silicon oxide (SiO$_2$), silicon nitride (SiN$_x$), or silicon oxyni-tride (SiON). The organic encapsulation layer 320 may include a polymer-based material. The polymer-based mate-rial may include acrylic resin, epoxy resin, polyimide, polyethylene, or the like. In an embodiment, the organic encapsulation layer 320 may include acrylate.

Although not illustrated, a touch electrode layer may be disposed on the encapsulation layer ENL, and an optical function layer may be disposed on the touch electrode layer. The touch electrode layer may obtain coordinate information according to an external input, e.g., a touch event. The optical function layer may reduce the reflectance of light (external light) incident from the outside toward the display device, and/or may improve the color purity of light emitted from the display device. In an embodiment, the optical function layer may include a retarder and/or a polarizer. In another embodiment, the optical function layer may include a black matrix and color filters. The color filters may be arranged considering the color of light emitted from each of the pixels of the display device. Each of the color filters may include a red, green, or blue pigment or dye. In an alternative embodiment, each of the color filters may further include, in addition to the pigment or dye, quantum dots. In an alter-native embodiment, some color filters may not include the pigment or dye described above, and may include scattering particles, such as titanium oxide.

In another embodiment, the optical function layer may include a destructive interference structure. The destructive interference structure may include a first reflective layer and a second reflective layer on different layers from each other. First reflected light and second reflected light, which are respectively reflected from the first reflective layer and the second reflective layer, may destructively interfere with each other, and thus, the reflectance of external light may be reduced.

An adhesive member may be between the touch electrode layer and the optical function layer. As the adhesive member, any general adhesive members known in the art may be employed without limitation. The adhesive member may be a pressure sensitive adhesive ("PSA") member.

The light-transmissive organic material layer OCL may be disposed on the encapsulation layer ENL. The light-transmissive organic material layer OCL may be an overcoat layer or a light-transmissive adhesive layer for bonding the cover window described above with reference to FIG. 2A.

Figure 8:
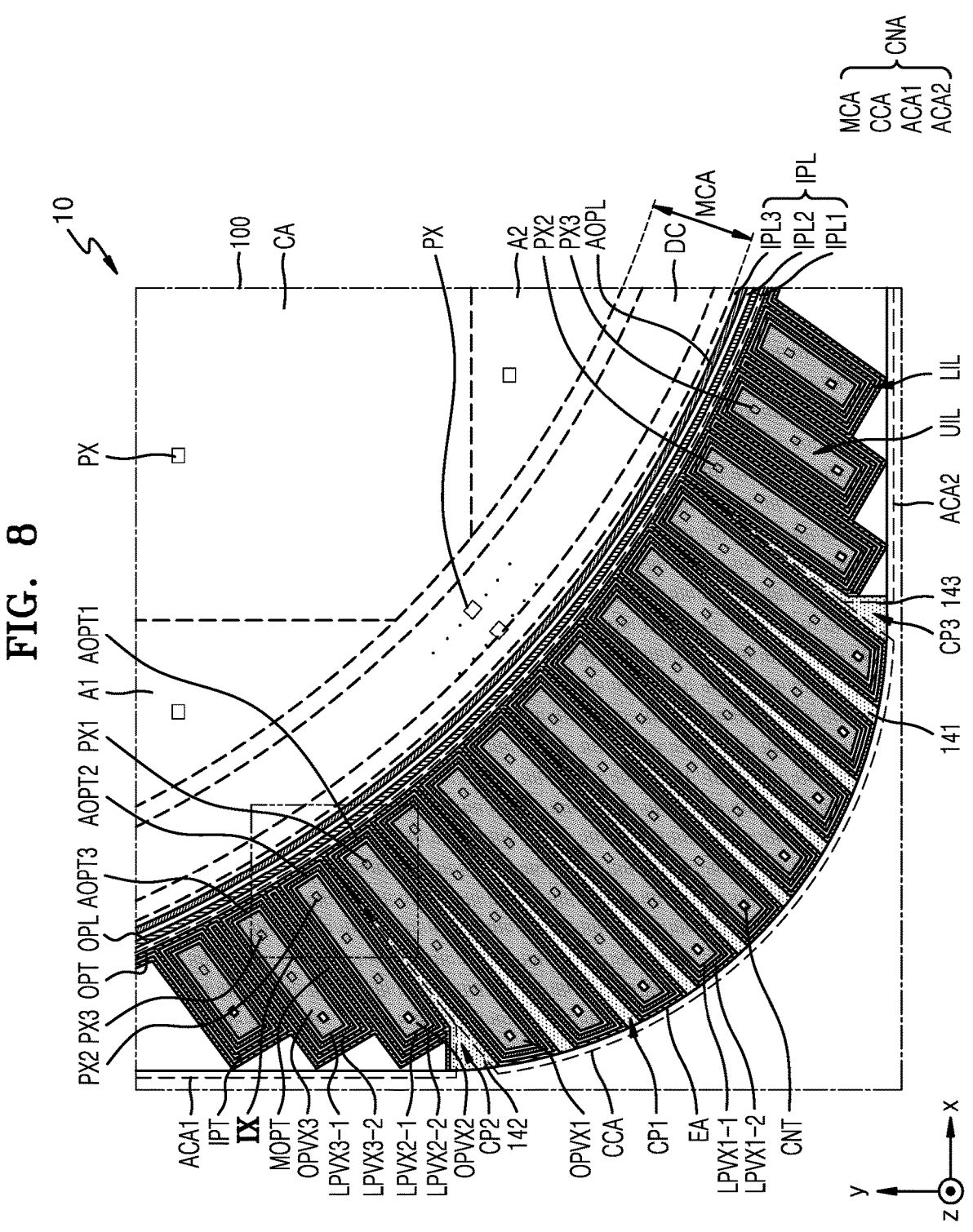
FIG. 8 is a plan view of an embodiment of the corner area of the display panel.
Figure 9:
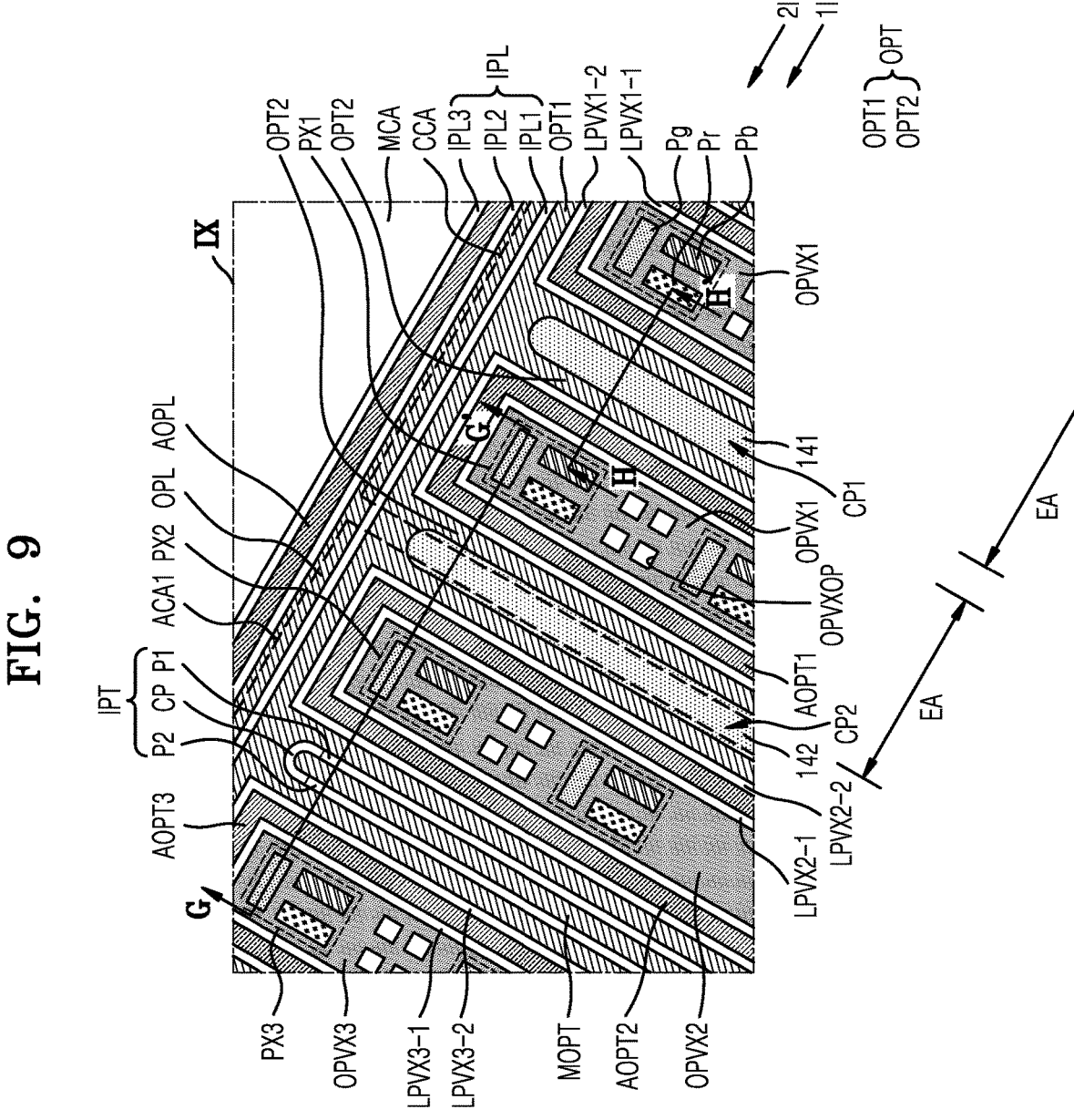
FIG. 9 is an enlarged plan view of an embodiment of a portion IX of FIG. 8.

FIG. 8 is a plan view of an embodiment of a corner area of the display panel 10, in an embodiment, and FIG. 9 is an enlarged plan view of an embodiment of a portion IX of FIG. 8. For convenience of description, a state in which the display panel 10 is unbent is illustrated in FIGS. 8 and 9.

Referring to FIGS. 8 and 9, the display panel 10 may include a central area CA, a first area A1, a second area A2, and a corner area CNA, as described above with reference to FIG. 4. In some embodiments, pixels PX may be arranged in the central area CA, the first area A1, the second area A2, and the corner area CNA.

A central corner area CCA may include extension areas EA extending in a direction away from the central area CA. Distal portions of the adjacent extension areas EA may be spaced apart from each other by first cutout patterns CP1. At least a portion of the first cutout pattern CP1 may be filled with a first organic filler 141.

A first adjacent corner area ACA1 and a second adjacent corner area ACA2 may be adjacent to the central corner area CCA. The first adjacent corner area ACA1 and the outermost extension area EA among the extension areas EA of the central corner area CCA may be spaced apart from each other by a second cutout pattern CP2. At least a portion of the second cutout pattern CP2 may be filled with a second organic filler 142. Similarly, the second adjacent corner area ACA2 and the outermost extension area EA among the extension areas EA of the central corner area CCA may be spaced apart from each other by a third cutout pattern CP3. At least a portion of the third cutout pattern CP3 may be filled with a third organic filler 143.

A middle corner area MCA may be between the central area CA and the central corner area CCA. The middle corner area MCA may extend between the first area A1 and the first adjacent corner area ACA1 and between the second area A2 and the second adjacent corner area ACA2. A driving circuit DC which provides an electrical signal to the pixel PX and/or a power line which supplies power to the pixel PX may be disposed in the middle corner area MCA. A predetermined structure therefor is the same as described above with reference to FIGS. 4 and 7.

A plurality of pixels may be arranged in the central corner area CCA, the first adjacent corner area ACA1, and the second adjacent corner area ACA2. In an embodiment, pixels (hereinafter referred to as first pixels PX1) may be arranged in the extension areas EA of the central corner area CCA, for example. The first pixels PX1 in the extension areas EA may be arranged in a direction away from the central area CA. The first pixels PX1 may be arranged in the longitudinal direction of the extension area EA. In other words, a pixel column of the first pixels PX1 arranged in a direction away from the central area CA may be disposed in the extension areas EA.

A plurality of pixel columns extending in a direction away from the central area CA may be arranged in the first adjacent corner area ACA1 and the second adjacent corner area ACA2. The pixel columns may include a first pixel column of pixels (hereinafter referred to as second pixels PX2) arranged in a direction away from the central area CA, and a second pixel column of pixels (hereinafter referred to as third pixels PX3) adjacent to the first pixel column and arranged in a direction away from the central area CA, for example.

The pixel PX may include sub-pixels. In an embodiment, the first pixel PX1, the second pixel PX2, and the third pixel PX3 may each include a red sub-pixel Pr, a green sub-pixel Pg, and a blue sub-pixel Pb, as illustrated in FIG. 9, for example. The red sub-pixel Pr, the green sub-pixel Pg, and the blue sub-pixel Pb may emit red light, green light, and blue light, respectively.

FIG. 9 illustrates that two sub-pixels selected from among the red sub-pixel Pr, the green sub-pixel Pg, and the blue sub-pixel Pb are adjacent to one side of the other sub-pixel, but the disclosure is not limited thereto. The red sub-pixel Pr, the green sub-pixel Pg, and the blue sub-pixel Pb may be adjacent to each other, and the arrangement thereof may be variously changed.

As illustrated in FIGS. 8 and 9, an organic pattern OPT, an organic pattern line OPL, first to third auxiliary organic patterns AOPT1, AOPT2, and AOPT3, and an auxiliary organic pattern line AOPL, and a middle organic pattern MOPT may be arranged in the corner area CNA. The organic pattern OPT, the organic pattern line OPL, the first to third auxiliary organic patterns AOPT1, AOPT2, and AOPT3, the auxiliary organic pattern line AOPL, and the middle organic pattern MOPT may be disposed on the front surface (or the upper surface) of the substrate 100, and may include the same organic insulating material as each other.

The organic pattern OPT may surround the pixel column of the first pixels PX1, the pixel column of the second pixels PX2, and the pixel column of the third pixels PX3. The pixel column of the first pixels PX1, the pixel column of the second pixels PX2, and the pixel column of the third pixels PX3 may be spatially separated from each other by the organic pattern OPT. As illustrated in FIG. 9, the organic pattern OPT may include a first portion OPT1 extending in the longitudinal direction of the middle corner area MCA, and second portions OPT2 integrally connected to the first portion OPT1 and extending in a direction crossing the first portion OPT1.

The first portion OPT1 may be between the central corner area CCA and the middle corner area MCA and may extend in the longitudinal direction of the middle corner area MCA. The second portion OPT2 may approximately have a U-shape. In an embodiment, the second portions OPT2 may extend along the edges of the extension areas EA, for example. Accordingly, the connection structure of a portion of the first portion OPT1 and the second portion OPT2 may surround the pixel column of the first pixels PX1. Similarly, the pixel column of the second pixels PX2 and the pixel column of the third pixels PX3 may be surrounded by the connection structure of a portion of the first portion OPT1 and the second portion OPT2.

The first to third auxiliary organic patterns AOPT1, AOPT2, and AOPT3 may surround the pixel column of the first pixels PX1, the pixel column of the second pixels PX2, and the pixel column of the third pixels PX3. The first auxiliary organic pattern AOPT1 may surround the pixel column of the first pixels PX1 arranged in the extension areas EA while being spaced apart from the organic pattern OPT. The first auxiliary organic pattern AOPT1 may be disposed in the extension areas EA, and may have a closed loop shape in a plan view.

Similarly, the second auxiliary organic pattern AOPT2 may surround the pixel column of the second pixels PX2 arranged in the first adjacent corner area ACA1 or the second adjacent corner area ACA2 while being spaced apart from the organic pattern OPT. The third auxiliary organic pattern AOPT3 may surround the pixel column of the third pixels PX3 arranged in the first adjacent corner area ACA1 or the second adjacent corner area ACA2 while being spaced apart from the organic pattern OPT. Each of the second auxiliary organic pattern AOPT2 and the third auxiliary organic pattern AOPT3 may have a closed loop shape in a plan view.

A portion of the organic pattern line OPL may extend between the central corner area CCA and the middle corner area MCA. In an embodiment, a portion of the organic pattern line OPL may be adjacent to the first portion OPT1 of the organic pattern OPT, and may extend in the same direction as the direction in which the first portion OPT1 of the organic pattern OPT extends, for example. FIGS. 8 and 9 are plan views illustrating a portion of the display panel 10. Although the organic pattern line OPL between the central corner area CCA and the middle corner area MCA is illustrated in FIGS. 8 and 9, the disclosure is not limited thereto. In an embodiment, the organic pattern line OPL may also extend to the peripheral area PA described above with reference to FIG. 3, and may have a closed loop shape in a plan view, for example. In an embodiment, referring to FIGS. 3 and 8, the organic pattern line OPL may have a closed loop shape surrounding the central area CA, the first areas A1, the second areas A2, and the middle corner areas MCA, for example.

The auxiliary organic pattern line AOPL may extend in the same direction as the direction in which the organic pattern line OPL extends while being spaced apart from the organic pattern line OPL. As illustrated in FIGS. 8 and 9, a portion of the auxiliary organic pattern line AOPL may extend between the central corner area CCA and the middle corner area MCA. The organic pattern line OPL may surround the auxiliary organic pattern line AOPL. FIGS. 8 and 9 are plan views illustrating a portion of the display panel 10. Although the auxiliary organic pattern line AOPL between the central corner area CCA and the middle corner area MCA is illustrated in FIGS. 8 and 9, the disclosure is not limited thereto. Similar to the organic pattern line OPL, the auxiliary organic pattern line AOPL may also extend to the peripheral area PA described above with reference to FIG. 3, and may have a closed loop shape in a plan view. In an embodiment, referring to FIGS. 3 and 8, the auxiliary organic pattern line AOPL may have a closed loop shape surrounding the central area CA, the first areas A1, the second areas A2, and the middle corner areas MCA, for example.

In an embodiment, the organic pattern OPT, the auxiliary organic pattern AOPT, the organic pattern line OPL, and the auxiliary organic pattern line AOPL may control the flow of materials constituting the organic encapsulation layer in the process of forming the organic encapsulation layer on the display element.

The middle organic pattern MOPT may be disposed in the first adjacent corner area ACA1. The middle organic pattern MOPT may be between the second portions OPT2 adjacent to each other. In an embodiment, the middle organic pattern MOPT may be between the pixel column of the second pixels PX2 and the pixel column of the third pixels PX3. In an embodiment, the middle organic pattern MOPT and the organic pattern OPT may be integrally connected to each other, as illustrated in FIG. 8.

An upper inorganic layer UIL may be disposed in the corner area CNA. The upper inorganic layer UIL may not be disposed in the central area CA. The upper inorganic layer UIL may include first to third overlapping inorganic patterns OPVX1, OPVX2, and OPVX3.

The first to third overlapping inorganic patterns OPVX1, OPVX2, and OPVX3 may respectively overlap the first to third pixels PX1, PX2, and PX3 and/or the display elements arranged in the corner area CNA. The first overlapping inorganic pattern OPVX1 may overlap the pixel column of the first pixels PX1, the second overlapping inorganic pattern OPVX2 may overlap the pixel column of the second pixels PX2, and the third overlapping inorganic pattern OPVX3 may overlap the pixel column of the third pixels PX3. The first to third overlapping inorganic patterns OPVX1, OPVX2, and OPVX3 may be spaced apart from each other. An opening (hereinafter referred to as an overlapping inorganic pattern opening OPVXOP) may be defined in each of the first to third overlapping inorganic patterns OPVX1, OPVX2, and OPVX3, as illustrated in FIG. 9.

The overlapping inorganic pattern opening OPVXOP may act as a passage through which gas generated from a layer (e.g., an organic material layer) under the overlapping inorganic pattern OPVX (refer to FIG. 10A) is discharged. The overlapping inorganic pattern opening OPVXOP may not overlap the display elements and/or the corresponding pixels among the first to third pixels PX1, PX2, and PX3.

A contact hole CNT may be defined in the first to third overlapping inorganic patterns OPVX1, OPVX2, and OPVX3 at an end portion, as illustrated in FIG. 8. The pixels (e.g., the first to third pixels PX1, PX2, and PX3) arranged in the central corner area CCA, the first adjacent corner area ACA1, and the second adjacent corner area ACA2 may receive the second power supply voltage ELVSS (refer to FIG. 6) through the contact holes CNT.

The upper inorganic layer UIL may further include additional pattern(s) in addition to the first to third overlapping inorganic patterns OPVX1, OPVX2, and OPVX3. In an embodiment, the upper inorganic layer UIL may include an upper inorganic pattern overlapping the organic pattern OPT, an auxiliary upper inorganic pattern overlapping the first to third auxiliary organic patterns AOPT1, AOPT2, and AOPT3, a first upper inorganic pattern line overlapping the organic pattern line OPL; a second upper inorganic pattern line overlapping the auxiliary organic pattern line AOPL, and a middle upper inorganic pattern overlapping the middle organic pattern MOPT, for example. The upper inorganic pattern may have substantially the same planar shape as the shape of the organic pattern OPT, and may extend in the same direction as the direction in which the organic pattern OPT extends. The auxiliary upper inorganic pattern may have substantially the same planar shape as the shapes of the first to third auxiliary organic patterns AOPT1, AOPT2, and AOPT3, and may extend in the same direction as the direction in which the first to third auxiliary organic patterns AOPT1, AOPT2, and AOPT3 extend. The first upper inorganic pattern line may have substantially the same planar shape as the shape of the organic pattern line OPL, and may extend in the same direction as the direction in which the organic pattern line OPL extends. The second upper inorganic pattern line may have substantially the same planar shape as the shape of the auxiliary organic pattern line AOPL, and may extend in the same direction as the direction in which the auxiliary organic pattern line AOPL extends. The middle upper inorganic pattern may extend similarly to the middle organic pattern MOPT. The upper inorganic layer UIL may include an inorganic material.

The lower inorganic layer LIL may be disposed in the corner area CNA. The lower inorganic layer LIL may not be disposed in the central area CA. The lower inorganic layer LIL may include a first inner inorganic pattern LPVX1-1, a second inner inorganic pattern LPVX2-1, and a third inner inorganic pattern LPVX3-1. The lower inorganic layer LIL may include a first outer inorganic pattern LPVX1-2, a second outer inorganic pattern LPVX2-2, and a third outer inorganic pattern LPVX3-2. The lower inorganic layer LIL may include an inorganic pattern line IPL and an inorganic pattern IPT. The lower inorganic layer LIL may include an inorganic material, for example an inorganic insulating material.

The first inner inorganic pattern LPVX1-1, the second inner inorganic pattern LPVX2-1, and the third inner inorganic pattern LPVX3-1 may each have a closed loop shape surrounding respective one of the pixel column of the first pixels PX1, the pixel column of the second pixels PX2, and the pixel column of the third pixels PX3. The first inner inorganic pattern LPVX1-1 may be between the first overlapping inorganic pattern OPVX1 and the first auxiliary organic pattern AOPT1. The second inner inorganic pattern LPVX2-1 may be between the second overlapping inorganic pattern OPVX2 and the second auxiliary organic pattern AOPT2. The third inner inorganic pattern LPVX3-1 may be between the third overlapping inorganic pattern OPVX3 and the third auxiliary organic pattern AOPT3.

The first outer inorganic pattern LPVX1-2, the second outer inorganic pattern LPVX2-2, and the third outer inorganic pattern LPVX3-2 may each have a closed loop shape surrounding respective one of the first inner inorganic pattern LPVX1-1, the second inner inorganic pattern LPVX2-1, and the third inner inorganic pattern LPVX3-1. The first outer inorganic pattern LPVX1-2 may be between the first auxiliary organic pattern AOPT1 and the organic pattern OPT. The second outer inorganic pattern LPVX2-2 may be between the second auxiliary organic pattern AOPT2 and the organic pattern OPT. The third outer inorganic pattern LPVX3-2 may be between the third auxiliary organic pattern AOPT3 and the organic pattern OPT.

The inorganic pattern line IPL may extend between the central corner area CCA and the middle corner area MCA. The inorganic pattern line IPL may surround at least one of the central area CA, the first area A1, the second area A2, or the middle corner area MCA.

The inorganic pattern line IPL may include a first inorganic pattern line IPL1, a second inorganic pattern line IPL2, and a third inorganic pattern line IPL3. The first inorganic pattern line IPL1 may be between the organic pattern OPT and the organic pattern line OPL. The second inorganic pattern line IPL2 may be between the organic pattern line OPL and the auxiliary organic pattern line AOPL. The auxiliary organic pattern line AOPL may surround the third inorganic pattern line IPL3.

The inorganic pattern IPT may be disposed in at least one of the first adjacent corner area ACA1 or the second adjacent corner area ACA2. The inorganic pattern IPT may extend between the pixel column of the second pixels PX2 and the pixel column of the third pixels PX3. In other words, the inorganic pattern IPT may be between the second pixel PX2 and the third pixel PX3. In an alternative embodiment, the inorganic pattern IPT may be between the display elements corresponding to the second pixel PX2 and the display elements corresponding to the third pixel PX3. The inorganic pattern IPT may extend in a serpentine manner.

In an embodiment, the inorganic pattern IPT may include a first portion P1, a curved portion CP, and a second portion P2. In an embodiment, the first portion P1 and the second portion P2 may be between the pixel column of the second pixels PX2 and the pixel column of the third pixels PX3, may extend in a direction away from the central area CA, and may be spatially connected to each other by the curved portion CP. The middle organic pattern MOPT may be between the first portion P1 and the second portion P2. The structure of the first adjacent corner area ACA1 illustrated in FIG. 9 may be equally applied to the second adjacent corner area (refer to ACA2 of FIG. 8).

In the illustrated embodiment, the first adjacent corner area ACA1 and the second adjacent corner area ACA2 may be bent. Unlike the illustrated embodiment, when the inorganic pattern IPT is bent at a portion in which the extending direction is changed, stress may concentrate on a portion in which the first adjacent corner area ACA1 is bent. In the illustrated embodiment, the inorganic pattern IPT may include the curved portion CP, and may prevent the concentration of stress from occurring.

Figure 10A:
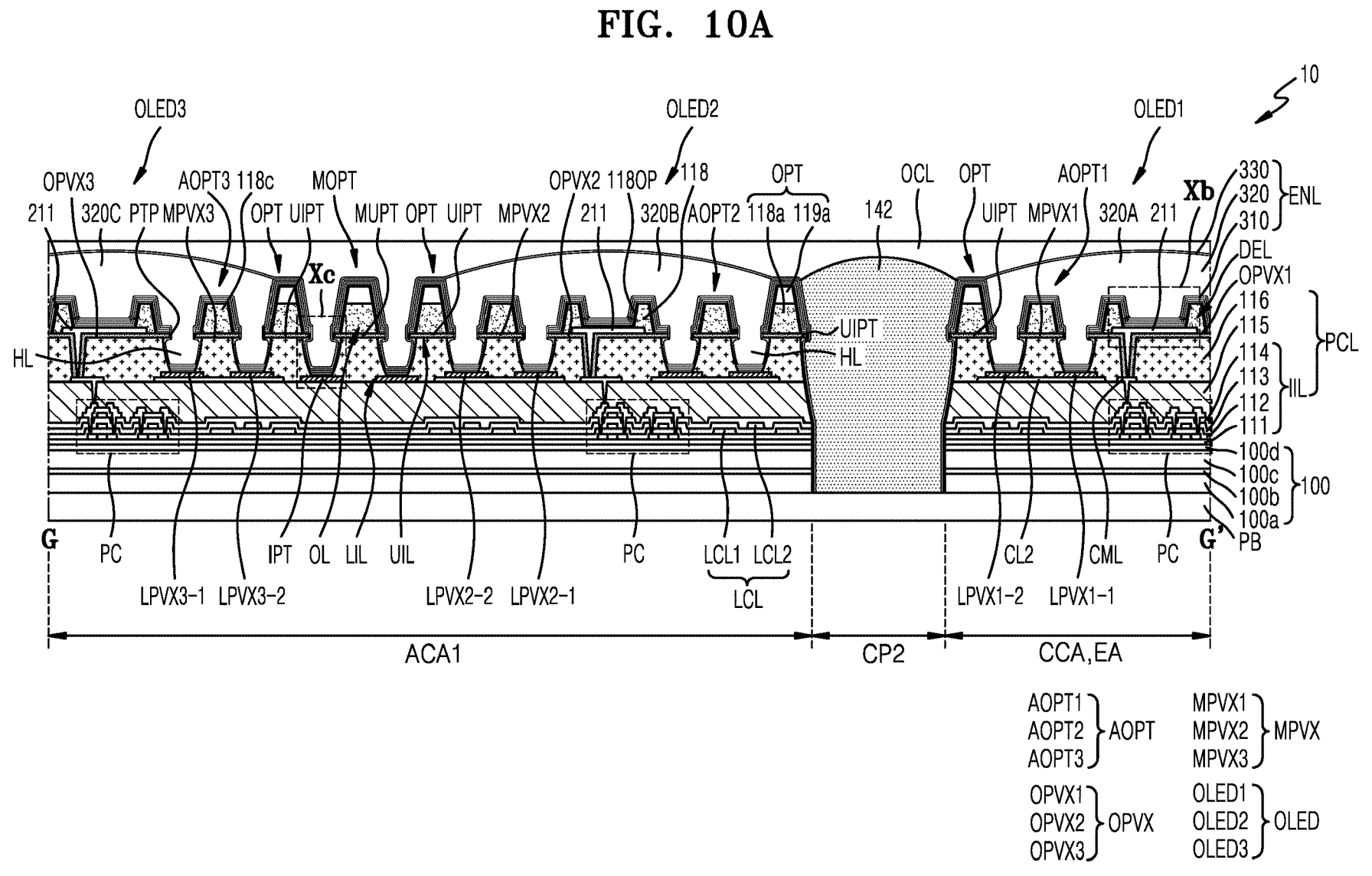
Figure 10B:
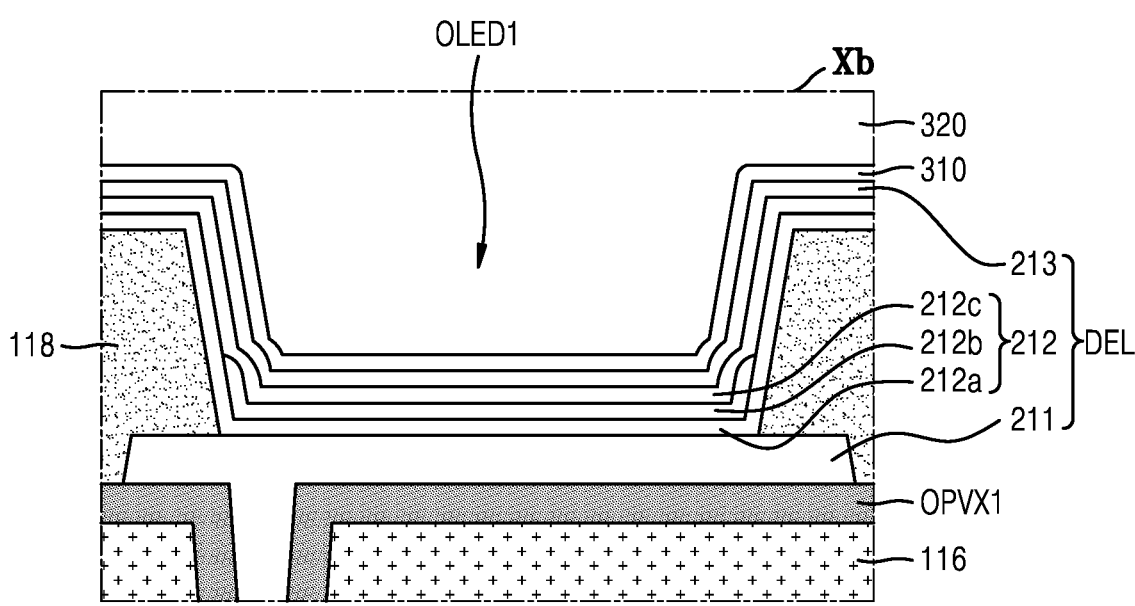
FIG. 10B is an enlarged view of an embodiment of a portion Xb in FIG. 10A.
Figure 10C:
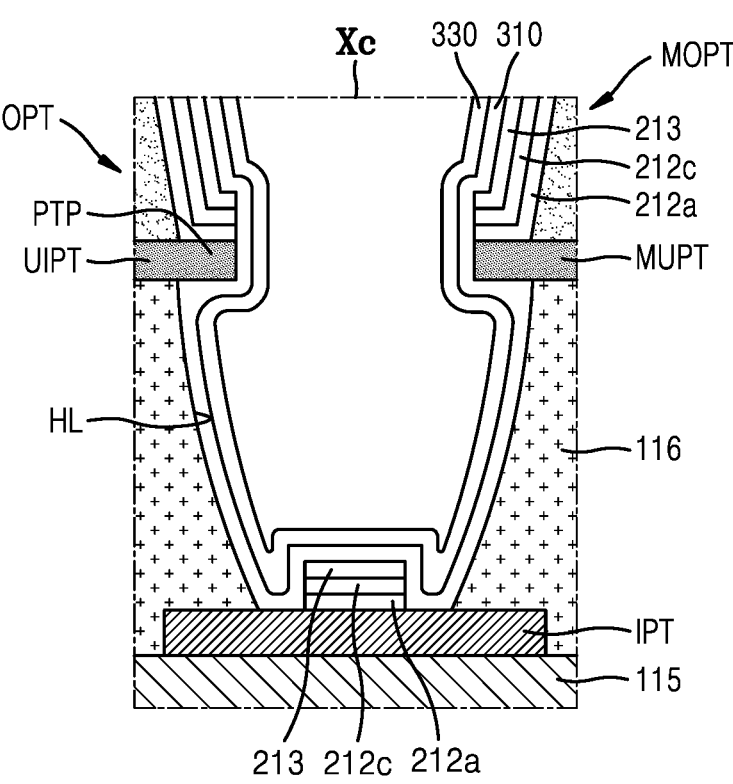
FIG. 10C is an enlarged view of an embodiment of a portion Xc in FIG. 10A.
Figure 11:
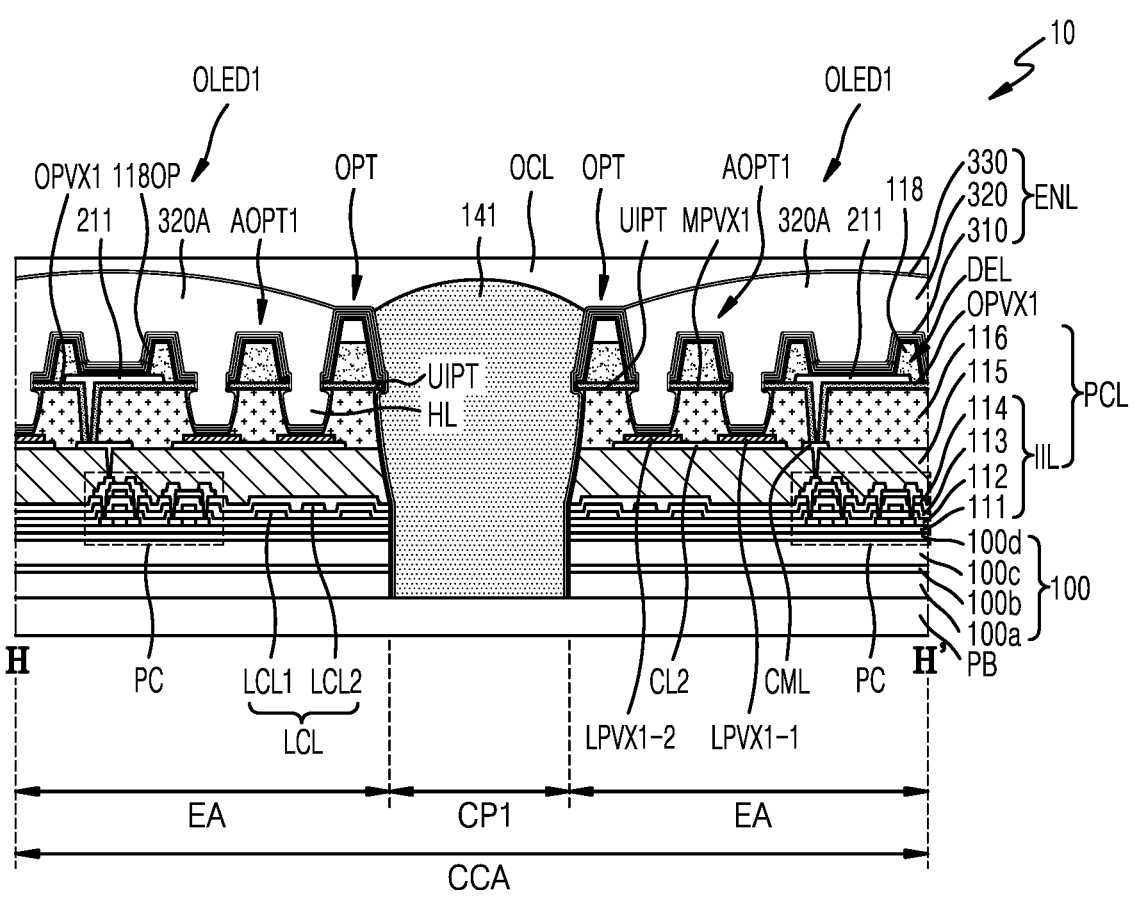
FIG. 11 is a schematic cross-sectional view of the display panel taken along line H-H' of FIG. 9.

FIG. 10A is a schematic cross-sectional view of an embodiment of the display panel 10 taken along line G-G' of FIG. 9, FIG. 10B is an enlarged view of an embodiment of a portion Xb in FIG. 10A, FIG. 10C is an enlarged view of an embodiment of a portion Xc in FIG. 10A, and FIG. 11 is a schematic cross-sectional view of the display panel 10 taken along line H-H' of FIG. 9. In FIGS. 10A, 10B, 10C, and 11, the same reference numerals as those in FIG. 7 denote the same members, and the descriptions thereof are replaced with those described above.

Referring to FIGS. 10A and 11, the display panel 10 may include a substrate 100, a pixel circuit layer PCL, a lower inorganic layer LIL, an upper inorganic layer UIL, a display element layer DEL, and an encapsulation. layer ENL. The substrate 100 may include a central corner area CCA and a first adjacent corner area ACA1, as illustrated in FIG. 10A. The central corner area CCA may include extension areas EA spaced apart from each other, as illustrated in FIG. 11. A first cutout pattern CP1 may be between the adjacent extension areas EA, and a second cutout pattern CP2 may be between the central corner area CCA and the first adjacent corner area ACA1. The display element layer DEL may include a plurality of organic light-emitting diodes as a plurality of display elements. Hereinafter, for convenience of description, the organic light-emitting diode disposed in the central corner area CCA is also referred to as a first organic light-emitting diode OLED1. The organic light-emitting diode corresponding to the pixel column of the second pixels PX2 (refer to FIG. 9) arranged in the first adjacent corner area ACA1 is also referred to as a second organic light-emitting diode OLED2. The organic light-emitting diode corresponding to the pixel column of the third pixels PX3 (refer to FIG. 9) arranged in the first adjacent corner area ACA1 is also referred to as a third organic light-emitting diode OLED3.

The pixel circuit layer PCL may include a lower connection line LCL, a sub-pixel circuit PC, an inorganic insulating layer IIL, a lower organic insulating layer 115, and an organic insulating layer 116. The inorganic insulating layer IIL may include a buffer layer 111, a first gate insulating layer 112, a second gate insulating layer 113, and an inter-insulating layer 114. In an embodiment, the inorganic insulating layer IIL may be between the substrate 100 and the first to third organic light-emitting diodes OLED1, OLED2, and OLED3 as the display elements. The lower organic insulating layer 115 and the organic insulating layer 116 may be between the inorganic insulating layer IIL and the first to third organic light-emitting diodes OLED1, OLED2, and OLED3 as the display elements.

In an embodiment, the lower connection line LCL may include a first lower connection line LCL1 and a second lower connection line LCL2. In an embodiment, the first lower connection line LCL1 may be between the first gate insulating layer 112 and the second gate insulating layer 113. The second lower connection line LCL2 may be between the second gate insulating layer 113 and the inter-insulating layer 114. In an embodiment, the first lower connection line LCL1 and the second lower connection line LCL2 may be alternately arranged with each other. Accordingly, the area occupied by the first lower connection line LCL1 and the second lower connection line LCL2 may be reduced.

The lower organic insulating layer 115 may cover the lower connection line LCL and the sub-pixel circuit PC. A second connection line CL2 and a connection electrode CML may be disposed on the lower organic insulating layer 115.

The inorganic insulating layer IIL, which is disposed in the central corner area CCA and the first adjacent corner area ACA1, may be disconnected by the first and second cutout patterns CP1 and CP2, and the lower organic insulating layer 115, which is disposed in the central corner area CCA and the first adjacent corner area ACA1, may be disconnected by the first and second cutout patterns CP1 and CP2. In an embodiment, a portion of the inorganic insulating layer IIL disposed in the central corner area CCA may be spaced apart from another portion of the inorganic insulating layer IIL disposed in the first adjacent corner area ACA1, for example. A portion of the lower organic insulating layer 115 disposed in the central corner area CCA may be spaced apart from another portion of the lower organic insulating layer 115 disposed in the first adjacent corner area ACA1. A portion of the inorganic insulating layer IIL disposed in one extension area EA may be spaced apart from another portion of the inorganic insulating layer IIL disposed in the adjacent extension area EA. A portion of the lower organic insulating layer 115 disposed in one extension area EA may be spaced apart from another portion of the lower organic insulating layer 115 disposed in the adjacent extension area EA. Accordingly, shrinkage stress or shrinkage strain occurring when the central corner area CCA is bent may be minimized.

The lower inorganic layer LIL may be disposed on the second connection line CL2 and/or the lower organic insulating layer 115. In an embodiment, the lower inorganic layer LIL may include a first inner inorganic pattern LPVX1-1, a second inner inorganic pattern LPVX2-1, and a third inner inorganic pattern LPVX3-1. In an embodiment, the lower inorganic layer LIL may further include a first outer inorganic pattern LPVX1-2, a second outer inorganic pattern LPVX2-2, and a third outer inorganic pattern LPVX3-2. The lower inorganic layer LIL may include an inorganic pattern IPT.

As described above with reference to FIGS. 8 and 9, the first inner inorganic pattern LPVX1-1, the second inner inorganic pattern LPVX2-1, and the third inner inorganic pattern LPVX3-1 may surround the first organic light-emitting diode OLED1, the second organic light-emitting diode OLED2, and the third organic light-emitting diode OLED3, respectively. The first outer inorganic pattern LPVX1-2, the second outer inorganic pattern LPVX2-2, and the third outer inorganic pattern LPVX3-2 may surround the first inner inorganic pattern LPVX1-1, the second inner inorganic pattern LPVX2-1, and the third inner inorganic pattern LPVX3-1, respectively.

The inorganic pattern IPT may be between the second organic light-emitting diode OLED2 and the third organic light-emitting diode OLED3. In an embodiment, the inorganic pattern IPT may be between the second outer inorganic pattern LPVX2-2 and the third outer inorganic pattern LPVX3-2.

The organic insulating layer 116 may be disposed on the inorganic pattern IPT. The organic insulating layer 116 may be disposed on the inorganic pattern IPT, the second connection line CL2, the connection electrode CML, and the lower organic insulating layer 115. In an embodiment, a hole HL may be defined in the organic insulating layer 116. In an embodiment, a plurality of holes HL may be defined and may overlap the lower inorganic layer LIL. The hole HL may expose at least a portion of the lower inorganic layer LIL.

In an embodiment, the hole HL of the organic insulating layer 116 may be defined by an etching process. The lower inorganic layer LIL may act as an etch stopper. The organic insulating layer 116 disposed in the central corner area CCA may be separated from the organic insulating layer 116 disposed in the first adjacent corner area ACA1 with the second cutout pattern CP2 therebetween, and the organic insulating layer 116 disposed in one extension area EA may be separated from the organic insulating layer 116 disposed in the adjacent extension area EA with the first cutout pattern CP1 therebetween.

The display element layer DEL may be disposed on the pixel circuit layer PCL. The display element layer DEL may include the first to third organic light-emitting diodes OLED1, OLED2, and OLED3 as the display elements.

The first to third organic light-emitting diodes OLED1, OLED2, and OLED3 may each include a first electrode 211, an intermediate layer 212 (refer to FIG. 10B), and a second electrode 213 (refer to FIG. 10B). In an embodiment, the intermediate layer 212 may include a first functional layer 212a, an emission layer 212b, and a second functional layer 212c, as illustrated in FIG. 10B.

A bank layer 118 may cover the edge of the first electrode 211. Openings 118OP of the bank layer 118 may define emission areas of the first to third organic light-emitting diodes OLED1, OLED2, and OLED3, respectively.

An organic pattern OPT may be disposed on the substrate 100, and may surround the first organic light-emitting diode OLED1, the second organic light-emitting diode OLED2, and the third organic light-emitting diode OLED3. A middle organic pattern MOPT may be between the organic patterns OPT disposed in the first adjacent corner area ACA1.

In an embodiment, the organic pattern OPT may include a first layer 118a and a second layer 119a disposed on the first layer 118a. In an embodiment, the first layer 118a of the organic pattern OPT may include the same material as the material of the bank layer 118. The second layer 119a of the organic pattern OPT may include the same material as the material of the spacer (refer to 119 of FIG. 7).

The first auxiliary organic pattern AOPT1 may be between the organic pattern OPT and the first organic light-emitting diode OLED1 in the extension area EA. The second auxiliary organic pattern AOPT2 may be between the organic pattern OPT and the second organic light-emitting diode OLED2 in the first adjacent corner area ACA1. The third auxiliary organic pattern AOPT3 may be between the organic pattern OPT and the third organic light-emitting diode OLED3 in the first adjacent corner area ACA1. The first to third auxiliary organic patterns AOPT1, AOPT2, and AOPT3 may include a first layer 118c including the same material as the material of the bank layer 118.

The middle organic pattern MOPT may be disposed in the first adjacent corner area ACA1. The middle organic pattern MOPT may be between the organic patterns OPT facing each other. In some embodiments, the middle organic pattern MOPT and the organic pattern OPT may be unitary as a single body.

The upper inorganic layer UIL may be between the organic insulating layer 116 and the display element layer DEL. In an embodiment, the upper inorganic layer UIL may include a first overlapping inorganic pattern OPVX1 overlapping the first organic light-emitting diode OLED1, a second overlapping inorganic pattern OPVX2 overlapping the second organic light-emitting diode OLED2, and a third overlapping inorganic pattern OPVX3 overlapping the third organic light-emitting diode OLED3. In an embodiment, the upper inorganic layer UIL may include an upper inorganic pattern UIPT overlapping the organic pattern OPT. The upper inorganic pattern UIPT may be between the organic insulating layer 116 and the organic pattern OPT. In an embodiment, the upper inorganic layer UIL may include first to third auxiliary inorganic patterns MPVX1, MPVX2, and MPVX3 respectively overlapping the first to third auxiliary organic patterns AOPT1, AOPT2, and AOPT3. The upper inorganic layer UIL may include a middle upper inorganic pattern MUPT overlapping the middle organic pattern MOPT.

The upper inorganic layer UIL may include a protruding tip PTP protruding in a direction toward the center of the hole HL. In an embodiment, the upper inorganic pattern UIPT may include a protruding tip PTP protruding in a direction toward the center of the hole HL. The direction toward the center of the hole HL may be a direction from the inner surface of the organic insulating layer 116 defining the hole HL to the central axis of the hole HL. Accordingly, the lower surface of the protruding tip PTP may be exposed to the hole HL. That is, the hole HL of the organic insulating layer 116 may have an undercut structure.

In the first adjacent corner area ACA1 and the extension areas EA, because the first functional layer 212a and the second functional layer 212c are disconnected from each other based on the hole HL, as illustrated in FIG. 10C, it is possible to prevent or reduce infiltration of moisture or foreign material into the first to third organic light-emitting diodes OLED1, OLED2, and OLED3.

The encapsulation layer ENL may cover the display element layer DEL. The encapsulation layer ENL may include at least one inorganic encapsulation layer and at least one organic encapsulation layer. FIGS. 10A to 10C illustrate that the encapsulation layer ENL includes a first inorganic encapsulation layer 310, an organic encapsulation layer 320, and a second inorganic encapsulation layer 330.

The first inorganic encapsulation layer 310 may continuously cover an entirety of the central corner area CCA and the first adjacent corner area ACA1. The first inorganic encapsulation layer 310 does not cover areas corresponding to the first and second cutout patterns CP1 and CP2.

The organic encapsulation layer 320 may cover the pixel columns. In an embodiment, the organic encapsulation layer 320 may include a first organic encapsulation area 320A covering the first organic light-emitting diodes OLED1 corresponding to the first pixels PX1 (refer to FIG. 9), a second organic encapsulation area 320B covering the second organic light-emitting diodes OLED2 corresponding to the second pixels PX2, and a third organic encapsulation area 320C covering the third organic light-emitting diodes OLED3 corresponding to the third pixels PX3, for example. The first organic encapsulation area 320A, the second organic encapsulation area 320B, and the third organic encapsulation area 320C may be separated from each other.

In an embodiment, the organic encapsulation layer 320 may fill the hole HL. In an embodiment, the organic encapsulation layer 320 may fill the holes HL. In an embodiment, the organic encapsulation layer 320 may fill the holes HL defined inside the organic pattern OPT.

Like the first inorganic encapsulation layer 310, the second inorganic encapsulation layer 330 may continuously cover an entirety of the central corner area CCA and the first adjacent corner area ACA1. In an embodiment, the second inorganic encapsulation layer 330 may contact the first inorganic encapsulation layer 310 on the organic pattern OPT. A light-transmissive organic material layer OCL may be disposed on the encapsulation layer ENL.

While the organic encapsulation areas of the organic encapsulation layer 320 are separated from each other with the first organic filler 141 or the second organic filler 142 therebetween, the light-transmissive organic material layer OCL may cover an entirety of the extension areas EA, the first adjacent corner area ACA1, the first organic filler 141, and the second organic filler 142. In an embodiment, as illustrated in FIG. 10A, the light-transmissive organic material layer OCL may continuously cover the extension area EA, the first adjacent corner area ACA1, and the second organic filler 142, for example. As illustrated in FIG. 11, the light-transmissive organic material layer OCL may continuously cover the extension areas EA and the first organic filler 141.

As illustrated in FIG. 10A, at least a portion of the second cutout pattern CP2 may be filled with the second organic filler 142. As illustrated in FIG. 11, at least a portion of the first cutout pattern CP1 may be filled with the first organic filler 141. Because the lower protection film PB is disposed on the back surface of the substrate 100, each of the first organic filler 141 and the second organic filler 142 may be in direct contact with at least a portion of the upper surface of the lower protection film PB.

A thickness of each of the first organic filler 141 and the second organic filler 142 may be greater than a thickness of the substrate 100. In an embodiment, the first portion (e.g., the lower portion) of the first organic filler 141 may be between the extension areas EA of the substrate spaced apart with the first cutout pattern CP1 therebetween, and the second portion (e.g., the upper portion) of the first organic filler 141 may be between the organic pattern OPT of one of the adjacent extension areas EA and the organic pattern OPT of another thereof, for example. The first portion (e.g., the lower portion) of the second organic filler 142 may be between the extension area EA and the first adjacent corner area ACA1 of the substrate 100 spaced apart with the second cutout pattern CP2 therebetween, and the second portion (e.g., the upper portion) of the second organic filler 142 may be between the organic pattern OPT disposed in the extension area EA and the organic pattern OPT disposed in the first adjacent corner area ACA1.

FIGS. 12A to 12I are cross-sectional views illustrating an embodiment of a method of manufacturing a display device.

Figure 12A:
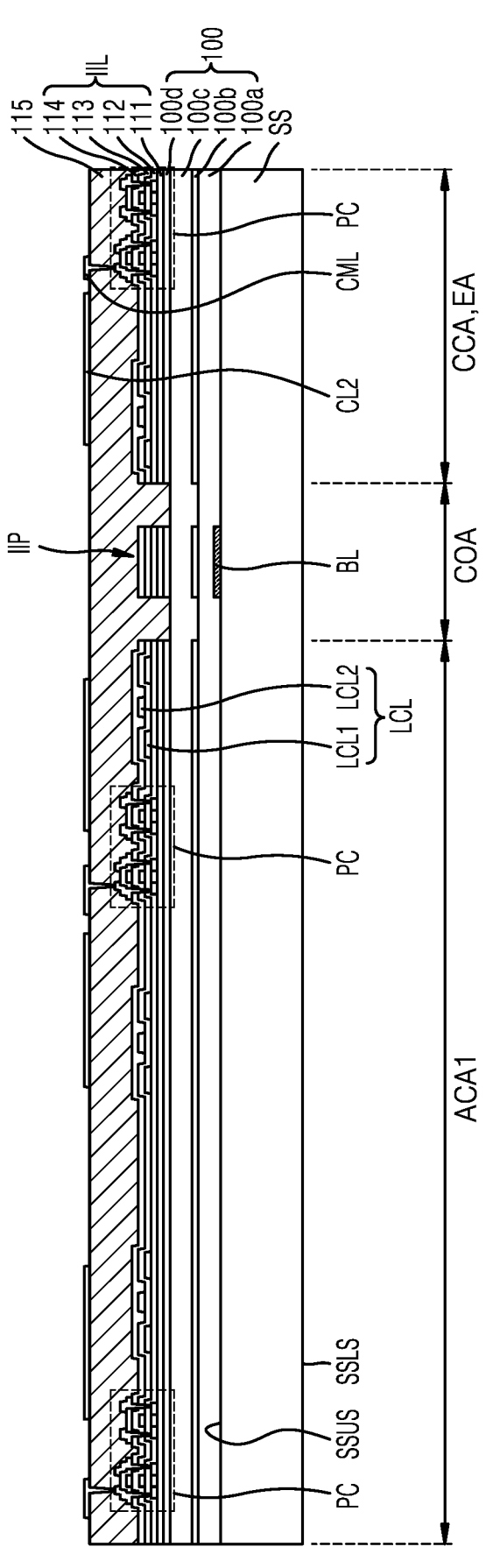

Referring to FIG. 12A, a substrate 100 is formed on a support substrate (or a carrier substrate) SS. As described above, the substrate 100 may include a central area, a first area, a second area, and a corner area. The corner area may include a central corner area including extension areas, and first and second adjacent corner areas. In this regard, FIG. 12A illustrates a first adjacent corner area ACA1, an extension area EA included in a central corner area CCA, and a cutout area COA. The cutout area COA is an area in which the first to third cutout patterns CP1 to CP3 described above with reference to FIG. 4 are to be formed.

Before the substrate 100 is formed, a blocking layer BL may be formed on the support substrate SS. The blocking layer BL may include a material capable of blocking a laser used in operation of separating the display panel and/or the display device under manufacture from the support substrate SS. In an embodiment, the blocking layer BL may include at least one of amorphous silicon (a-Si), polysilicon (poly-Si), crystalline silicon (crystalline-Si), $ZnO_x$ (such as ZnO or $ZnO_2$), or IZO, for example. The blocking layer BL may be formed by patterning through an exposure and development process using a photoresist. The blocking layer BL may be formed in an area corresponding to the first to third cutout patterns CP1 to CP3 described above with reference to FIG. 4. In this regard, FIG. 12A illustrates that the blocking layer BL is formed in the cutout area COA.

The substrate 100 may include a first base layer 100a, a first barrier layer 100b, a second base layer 100c, and a second barrier layer 100d. The first base layer 100a and the second base layer 100c may be continuously formed on the support substrate 100 over the central corner area CCA, the cutout area COA, and the first adjacent corner area ACA1. In an embodiment, the first barrier layer 100b and the second barrier layer 100d may be formed discontinuously. In another embodiment, the first barrier layer 100b and the second barrier layer 100d may be formed continuously.

An inorganic insulating layer IIL, a sub-pixel circuit PC, and a lower connection line LCL may be formed on the substrate 100. In an embodiment, a portion of the inorganic insulating layer IIL disposed in the central corner area CCA may be spaced apart from a portion of the inorganic insulating layer IIL disposed in the first adjacent corner area ACA1. In an embodiment, an inorganic insulating pattern IIP may be disposed in the cutout area COA. The inorganic insulating pattern IIP may be spaced apart from a portion of the inorganic insulating layer IIL disposed in the central corner area CCA and a portion of the inorganic insulating layer IIL disposed in the first adjacent corner area ACA1.

In an embodiment, the lower connection line LCL may include a first lower connection line LCL1 and a second lower connection line LCL2. In an embodiment, the first lower connection line LCL1 may be between a first gate insulating layer 112 and a second gate insulating layer 113. The second lower connection line LCL2 may be between the second gate insulating layer 113 and an inter-insulating layer 114.

The lower organic insulating layer 115 may be formed on the inorganic insulating layer IIL and the sub-pixel circuit PC. The lower organic insulating layer 115 may be continuously formed in the central corner area CCA, the cutout area COA, and the first adjacent corner area ACA1.

A second connection line CL2 and a connection electrode CML may be formed on the lower organic insulating layer 115. The second connection line CL2 and the connection electrode CML may include a conductive material, e.g., a metal.

Figure 12B:
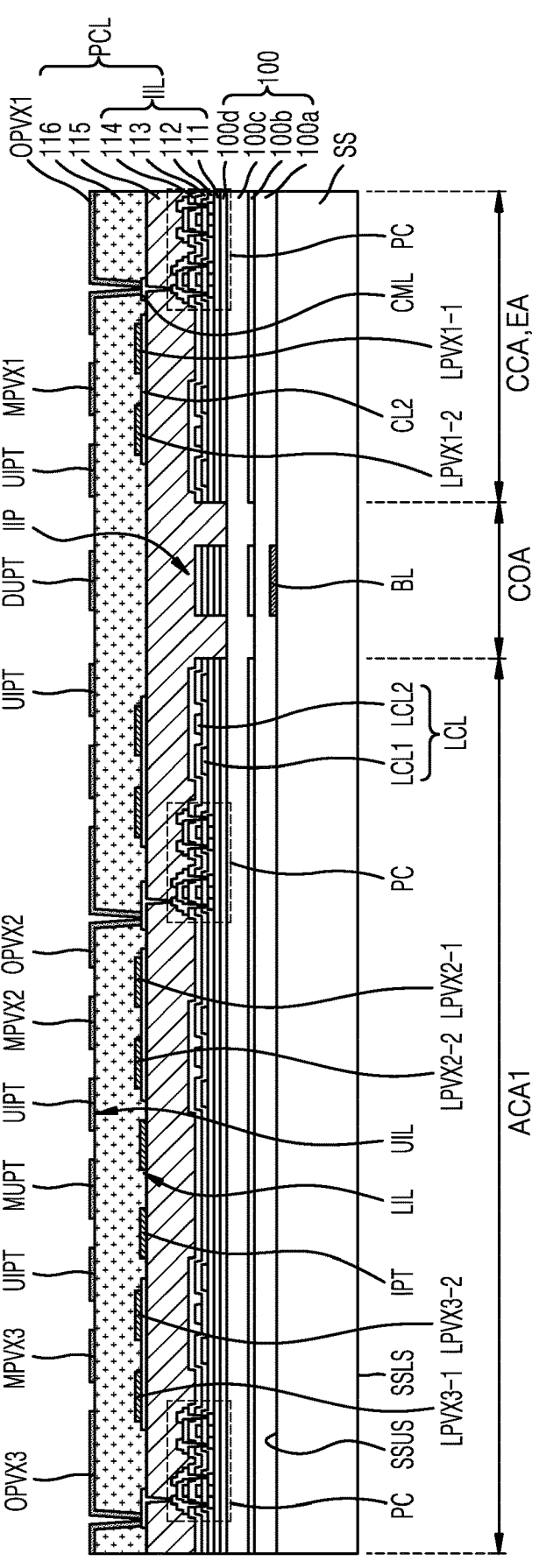

Referring to FIG. 12B, a lower inorganic layer LIL may be formed on the lower organic insulating layer 115 and/or the second connection line CL2. The lower inorganic layer LIL may include a first inner inorganic pattern LPVX1-1, a second inner inorganic pattern LPVX2-1, a third inner inorganic pattern LPVX3-1, a first outer inorganic pattern LPVX1-2, a second outer inorganic pattern LPVX2-2, and a third outer inorganic pattern LPVX3-2. The lower inorganic layer LIL may include an inorganic pattern IPT.

The first inner inorganic pattern LPVX1-1, the second inner inorganic pattern LPVX2-1, and the third inner inorganic pattern LPVX3-1 may be formed in a closed loop shape in a plan view, as described above with reference to FIGS. 8 and 9. The first inner inorganic pattern LPVX1-1 may be formed in the extension areas EA of the central corner area CCA. The second inner inorganic pattern LPVX2-1 and the third inner inorganic pattern LPVX3-1 may be formed in the first adjacent corner area ACA1.

In an embodiment, the first outer inorganic pattern LPVX1-2, the second outer inorganic pattern LPVX2-2, and the third outer inorganic pattern LPVX3-2 may be formed in a closed loop shape a plan view, as described above with reference to FIGS. 8 and 9. The first outer inorganic pattern LPVX1-2 may be formed in the extension areas EA of the central corner area CCA, and the second outer inorganic pattern LPVX2-2 and the third outer inorganic pattern LPVX3-2 may be formed in the first adjacent corner area ACA1.

An organic insulating layer 116 may be formed on the lower organic insulating layer 115, the lower inorganic layer LIL, the second connection line CL2, and the connection electrode CML. The organic insulating layer 116 may be continuously formed in the central corner area CCA, the cutout area COA, and the first adjacent corner area ACA1. In an embodiment, a hole exposing the connection electrode CML may be defined in the organic insulating layer 116.

An upper inorganic layer UIL may be formed on the organic insulating layer 116. The upper inorganic layer UIL may include first to third overlapping inorganic patterns OPVX1, OPVX2, and OPVX3, an upper inorganic pattern UIPT, first to third auxiliary inorganic patterns MPVX1, MPVX2, and MPVX3, a middle upper inorganic pattern MUPT, and a dummy upper inorganic pattern DUPT. The dummy upper inorganic pattern DUPT may be formed to correspond to the first to third cutout patterns. In this regard, FIG. 12B illustrates the dummy upper inorganic pattern DUPT in the cutout area COA.

The upper inorganic pattern UIPT may surround the first overlapping inorganic pattern OPVX1, the second overlapping inorganic pattern OPVX2, and the third overlapping inorganic pattern OPVX3 in a plan view. The middle upper inorganic pattern MUPT may be disposed in the first adjacent corner area ACA1. A portion of the middle upper inorganic pattern MUPT may be between the upper inorganic patterns UIPT adjacent to each other. In an embodiment, the middle upper inorganic pattern MUPT and the upper inorganic pattern UIPT may be unitary as a single body.

The dummy upper inorganic pattern DUPT may be disposed in the cutout area COA. In an embodiment, the dummy upper inorganic pattern DUPT may be between the adjacent upper inorganic patterns UIPT arranged in the central corner area CCA. The dummy upper inorganic pattern DUPT may be between the upper inorganic pattern UIPT disposed in the central corner area CCA and the upper inorganic pattern UIPT disposed in the first adjacent corner area ACA1. The dummy upper inorganic pattern DUPT and the upper inorganic pattern UIPT may be spaced apart from each other.

Figure 12C:
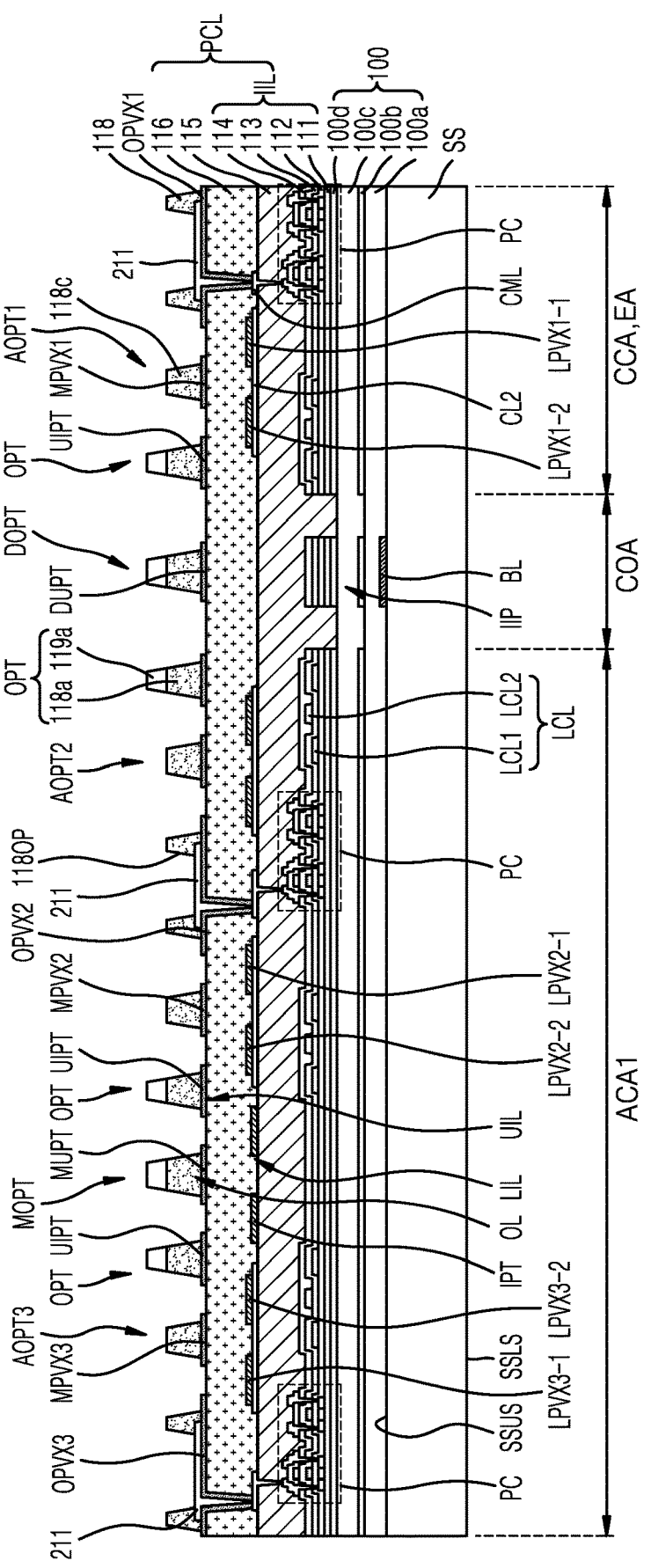

Referring to FIG. 12C, first electrodes 211 may be formed on the first to third overlapping inorganic patterns OPVX1, OPVX2, and OPVX3. An organic insulating material layer (s) may be formed and patterned to form a bank layer 118, an organic pattern OPT, first to third auxiliary organic patterns AOPT1, AOPT2, and AOPT3, a middle organic pattern MOPT, and a dummy organic pattern DOPT.

The bank layer 118 may cover an edge of each of the first electrodes 211, and may include an opening 118OP overlapping a portion of each of the first electrodes 211. The organic pattern OPT may include a first layer 118a and a second layer 119a disposed on the first layer 118a.

The first to third auxiliary organic patterns AOPT1, AOPT2, and AOPT3 may be spaced apart from the organic pattern OPT. The positions of the organic patterns OPT and the first to third auxiliary organic patterns AOPT1, AOPT2, and AOPT3 are the same as described above with reference to FIG. 8.

The middle organic pattern MOPT may be disposed in the first adjacent corner area ACA1. The middle organic pattern MOPT may be disposed on the middle upper inorganic pattern MUPT. The middle organic pattern MOPT may be between the adjacent organic patterns OPT. In some embodiments, the middle organic pattern MOPT and the organic pattern OPT may be unitary as a single body.

The dummy organic pattern DOPT may be disposed in the cutout area COA. The dummy organic pattern DOPT may be disposed on the dummy upper inorganic pattern DUPT.

Figure 12D:
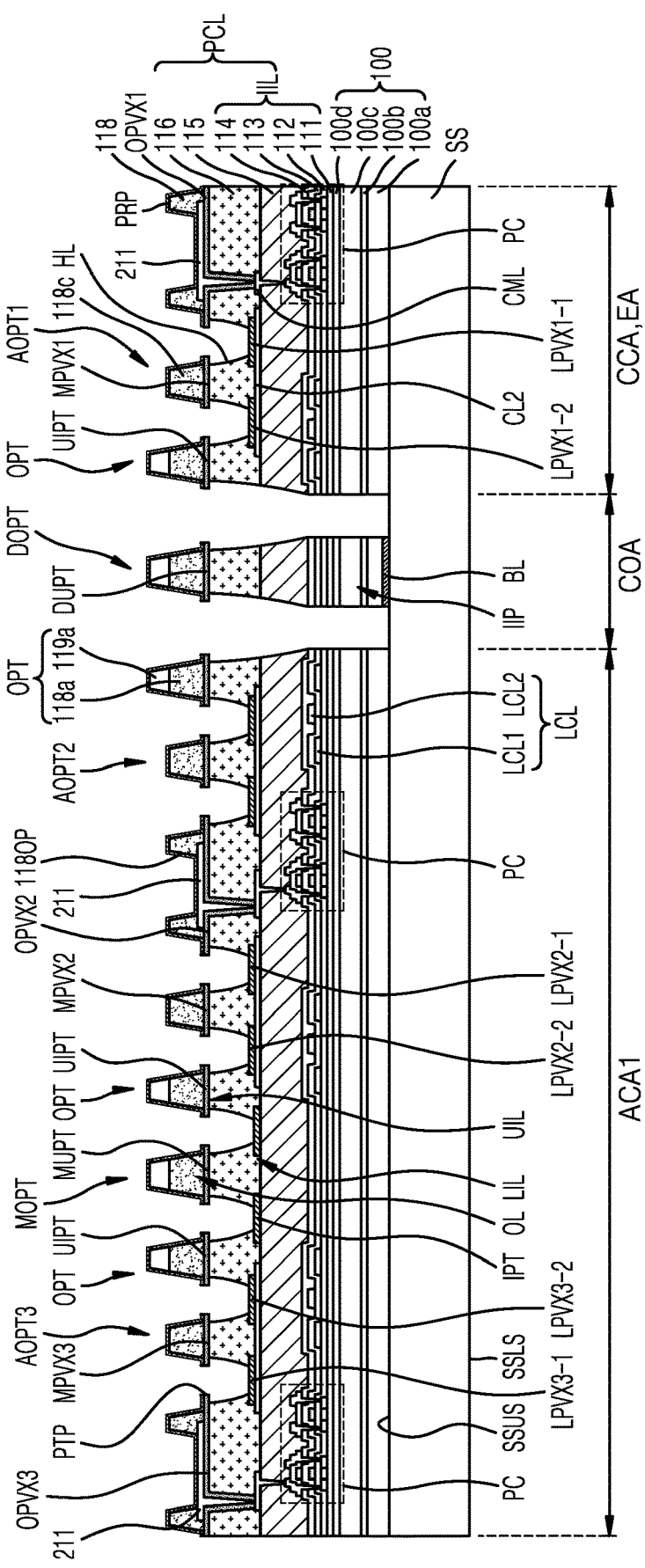

Referring to FIG. 12D, a portion of the substrate 100 corresponding to the cutout area COA may be removed. In this regard, FIG. 12D illustrates that a portion of the substrate 100 disposed on opposite sides of the dummy organic pattern DOPT in the cutout area COA is removed.

The process of removing a portion of the substrate 100 corresponding to the cutout area COA is performed by forming protective patterns PRP and etching (e.g., dry-etching) a portion that is not covered by the protective patterns PRP. A hole HL may be formed in the etching process of removing a portion of the substrate 100. The hole HL may be defined by removing a portion of the organic insulating layer 116.

Figure 12E:
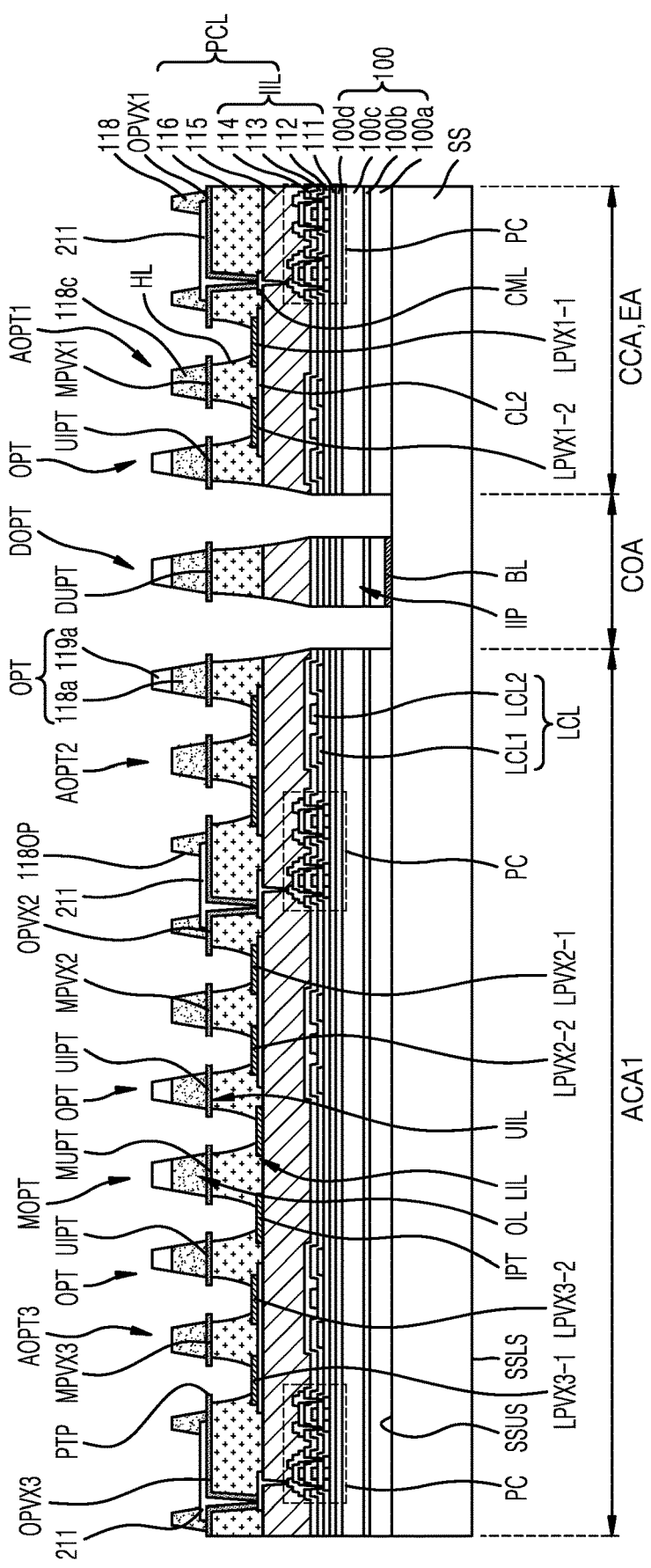

As illustrated in FIG. 12E, the protective patterns PRP as shown in FIG. 12D may be removed. In an embodiment, the protective patterns PRP may be removed by a wet etching process.

Figure 12F:
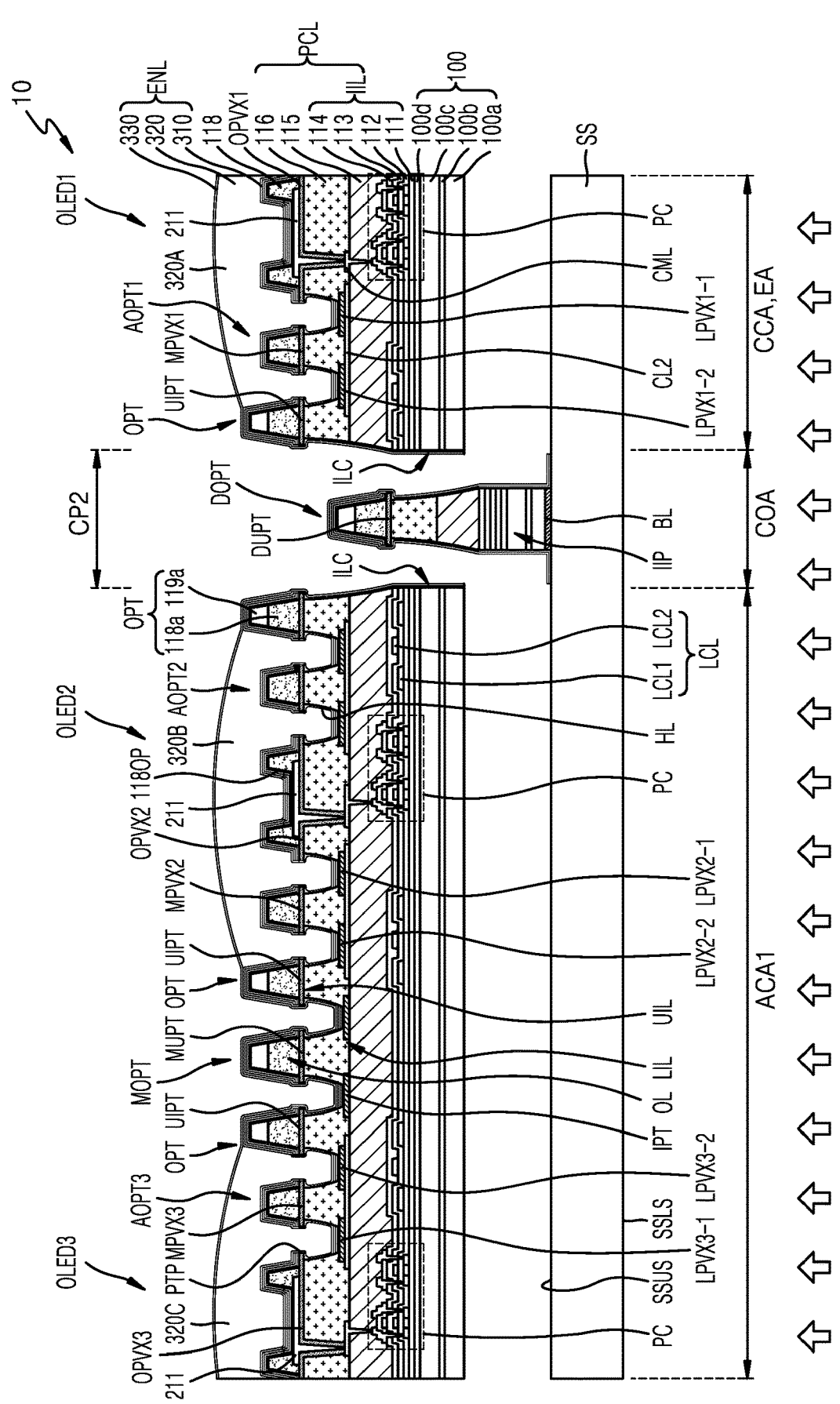

Referring to FIG. 12F, first to third organic light-emitting diodes OLED1, OLED2, and OLED3 may be formed by forming emission layers on the first electrodes 211 and forming second electrodes on the emission layers. In this case, a first functional layer and a second functional layer between the first electrode 211 and the second electrode may each be disconnected or separated at a position corresponding to the hole HL, as described above with reference to FIG. 10C. In an embodiment, the upper inorganic layer UIL has a protruding tip PTP protruding in a direction toward the center of the hole HL of the organic insulating layer 116, and the first functional layer, the second functional layer, and the second electrode may each be disconnected based on the hole HL, as described above with reference to FIG. 10B, for example. Accordingly, it is possible to prevent or reduce infiltration of external moisture and foreign material into the central corner area CCA and the first adjacent corner area ACA1 through the first functional layer and/or the second functional layer, which are organic materials.

An encapsulation layer ENL may be formed on the first to third organic light-emitting diodes OLED1, OLED2, and OLED3. The encapsulation layer ENL may include a first inorganic encapsulation layer 310, an organic encapsulation layer 320, and a second inorganic encapsulation layer 330.

The first inorganic encapsulation layer 310 may continuously cover an entirety of the central corner area CCA. Also, the first inorganic encapsulation layer 310 may continuously cover an entirety of the first adjacent corner area ACA1. A portion of the first inorganic encapsulation layer 310 in the extension area EA may be separated from a portion of the first inorganic encapsulation layer 310 in the first adjacent corner area ACA1.

The organic encapsulation layer 320 may cover the first to third organic light-emitting diodes OLED1, OLED2, and OLED3. The organic encapsulation layer 320 may include a first organic encapsulation area 320A covering the first organic light-emitting diode OLED1, a second organic encapsulation area 320B covering the second organic light-emitting diode OLED2, and a third organic encapsulation area 320C covering the third organic light-emitting diode OLED3. The expression "the first organic encapsulation area 320A covers the first organic light-emitting diode OLED1" may mean that the first organic encapsulation area 320A covers the first display elements corresponding to the first pixels and/or the pixel column including the first pixels. Similarly, the expression "the second organic encapsulation area 320B covers the second organic light-emitting diode OLED2" may mean that the second organic encapsulation area 320B covers the second display elements corresponding to the second pixels and/or the pixel column including the second pixels. The expression "the third organic encapsulation area 320C covers the third organic light-emitting diode OLED3" may mean that the third organic encapsulation area 320C covers the third display elements corresponding to the third pixels and/or the pixel column including the third pixels. FIG. 12F illustrates that the first organic encapsulation area 320A covers the first organic light-emitting diode OLED1 disposed in one extension area EA, but the disclosure is not limited thereto. The first organic encapsulation areas 320A are arranged in the central corner area CCA, and the first organic encapsulation area 320A may cover the first organic light-emitting diode OLED1 disposed in the corresponding extension area EA.

A second inorganic encapsulation layer 330 is formed. The second inorganic encapsulation layer 330 may have the same shape as the shape of the first inorganic encapsulation layer. The first and second inorganic encapsulation layers 310 and 330 may be in direct contact with each other around the edge of the organic encapsulation layer 320. In this regard, FIG. 12F illustrates that a side surface of a portion of the display panel 10 corresponding to the extension area EA and a side surface of a portion of the display panel 10 corresponding to the first adjacent corner area ACA1 are covered with a contact portion ILC of the first and second inorganic encapsulation layers 310 and 330.

The substrate 100 and the structure on the substrate 100 are separated from support substrate SS. The laser may be irradiated from a rear surface SSLS of the support substrate SS toward a front surface SSUS of the support substrate SS. As the laser, e.g., an excimer laser having a wavelength of about 308 nanometers (nm) or a solid ultra-violet ("UV") laser having a wavelength of about 343 nm or about 355 nm may be used.

The first to third cutout patterns may be formed through the separating process described above. In an embodiment, FIG. 12F illustrates that a second cutout pattern CP2 is formed. Referring to FIG. 12F, a portion of the substrate 100 in the cutout area COA and the structure (e.g., the dummy organic pattern DOPT) thereon are separated to form the second cutout pattern CP2.

Figure 12G:
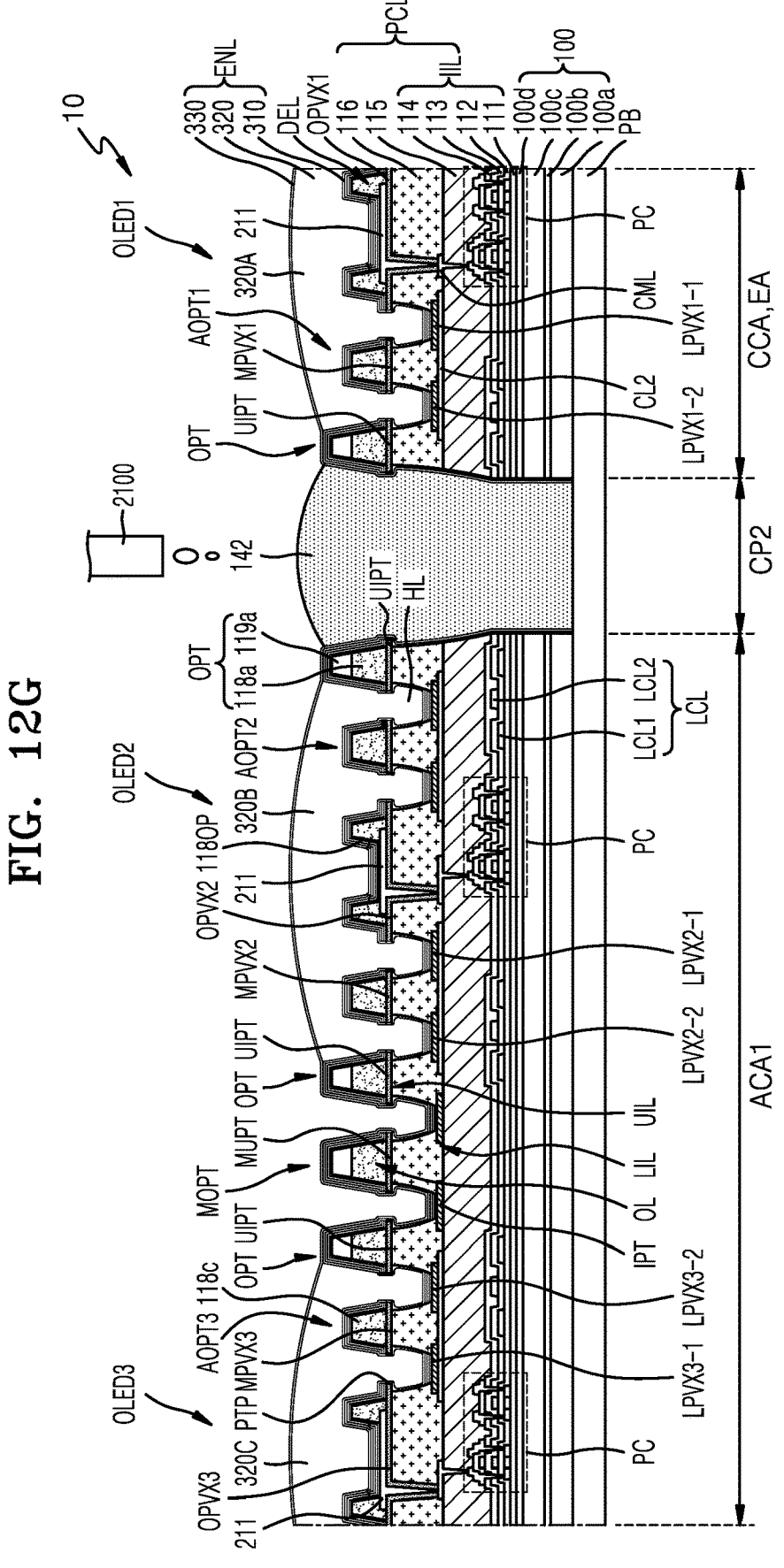

Referring to FIG. 12G, a lower protection film PB may be formed on the rear surface of the substrate 100 on which the first to third cutout patterns are formed, and an organic filler may be formed in the first to third cutout patterns. In this regard, FIG. 12G illustrates a second organic filler 142 injected into the cutout area COA. The second organic filler 142 and the first and third organic fillers to be in the first and third cutout patterns may include a curable shrinkage material, as described above, and may be injected by an inkjet method using an injector 2100.

The curable shrinkage material may be a photo-curable shrinkage material or a thermo-curable shrinkage material. The photo-curable shrinkage material may be, e.g., a monomer, such as HDDA, and may be cured into a polymer. Other photo-curable shrinkage materials may include TMPTA, trimethylolpropane triacrylate TMP(EO)$_M$TA, PETA, DPHA, or the like. The lower protection film PB may include an organic material, such as PET or PDMS.

The curable shrinkage material has fluidity. Therefore, after the curable shrinkage material is injected by an inkjet method, the curable shrinkage material may be temporarily cured (or primarily cured) by light or heat, and thus, fluidity may be reduced after the injection. The curable shrinkage material may be in direct contact with a portion of the upper surface of the lower protection film PB.

The thickness of the organic filler filling the cutout pattern may be greater than the thickness of the substrate 100. In this regard, FIG. 12G illustrates that the thickness of the second organic filler 142 is greater than the thickness of the substrate 100. In an embodiment, a first portion (e.g., a lower portion) of the second organic filler 142 may be between the extension area EA and the first adjacent corner area ACA1 of the substrate spaced apart with the second cutout pattern CP2 therebetween, and a second portion (e.g., an upper portion) of the second organic filler 142 may be between the organic pattern OPT disposed in the extension area EA and the organic pattern OPT disposed in the first adjacent corner area ACA1. Although not illustrated in FIG. 12G, the first organic filler and the third organic filler also have the same structure as the structure of the second organic filler 142.

Figure 12H:
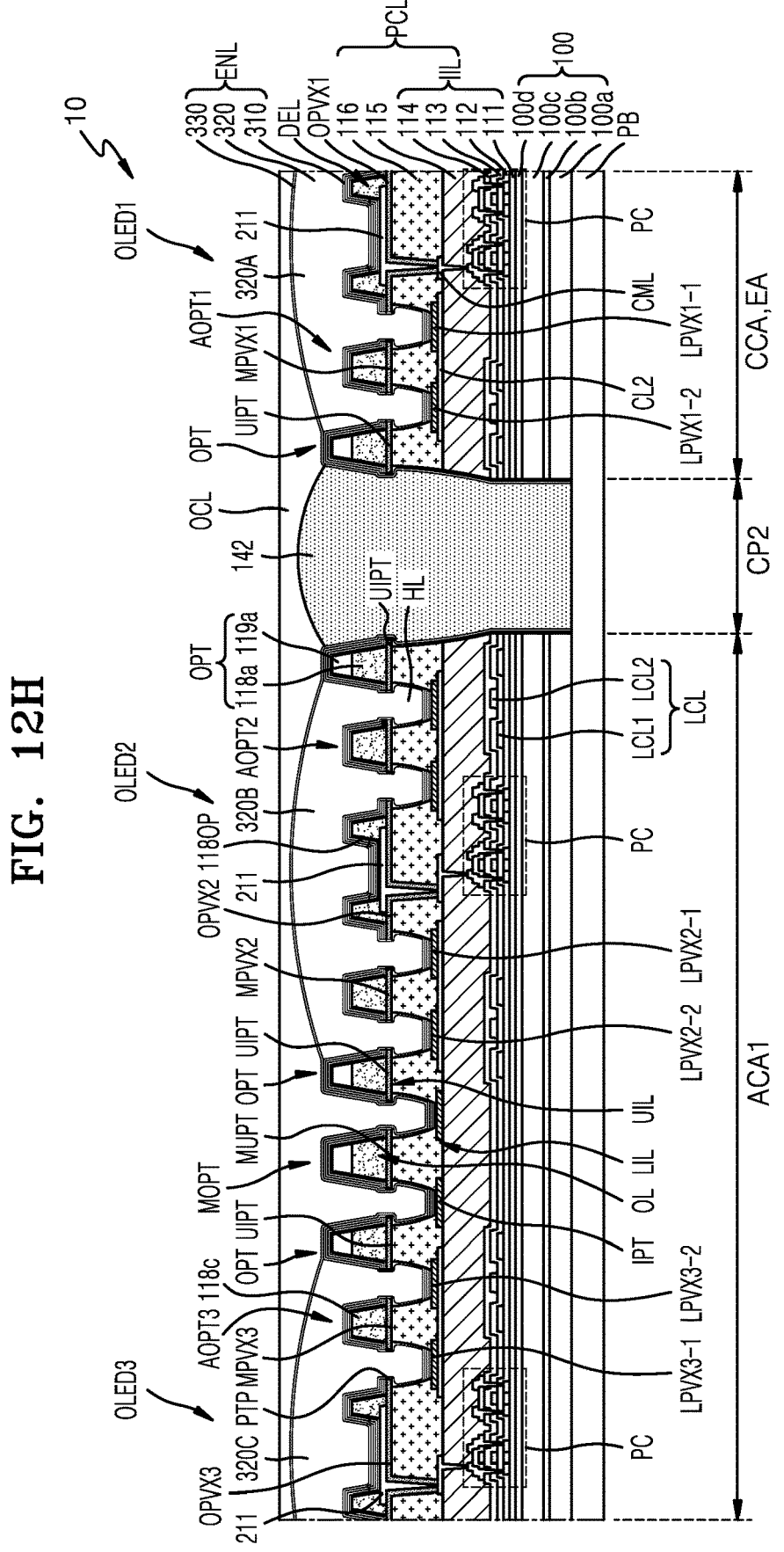

Referring to FIG. 12H, a light-transmissive organic material layer OCL may be formed on the encapsulation layer ENL. The light-transmissive organic material layer OCL may cover an entirety of the substrate 100 and the organic filler. In this regard, FIG. 12H illustrates that the light-transmissive organic material layer OCL covers an entirety of the first adjacent corner area ACA1, the central corner area CCA, and the second cutout pattern CP2. As described above, the light-transmissive organic material layer OCL also covers the first cutout pattern and the third cutout pattern. The expression "the light-transmissive organic material layer OCL covers the central corner area CCA" may mean that the first cutout pattern between the extension areas EA in the central corner area CCA and the adjacent extension areas EA is continuously covered. In an embodiment, the light-transmissive organic material layer OCL may be an overcoat layer or a material layer having adhesive properties.

Figure 12I:
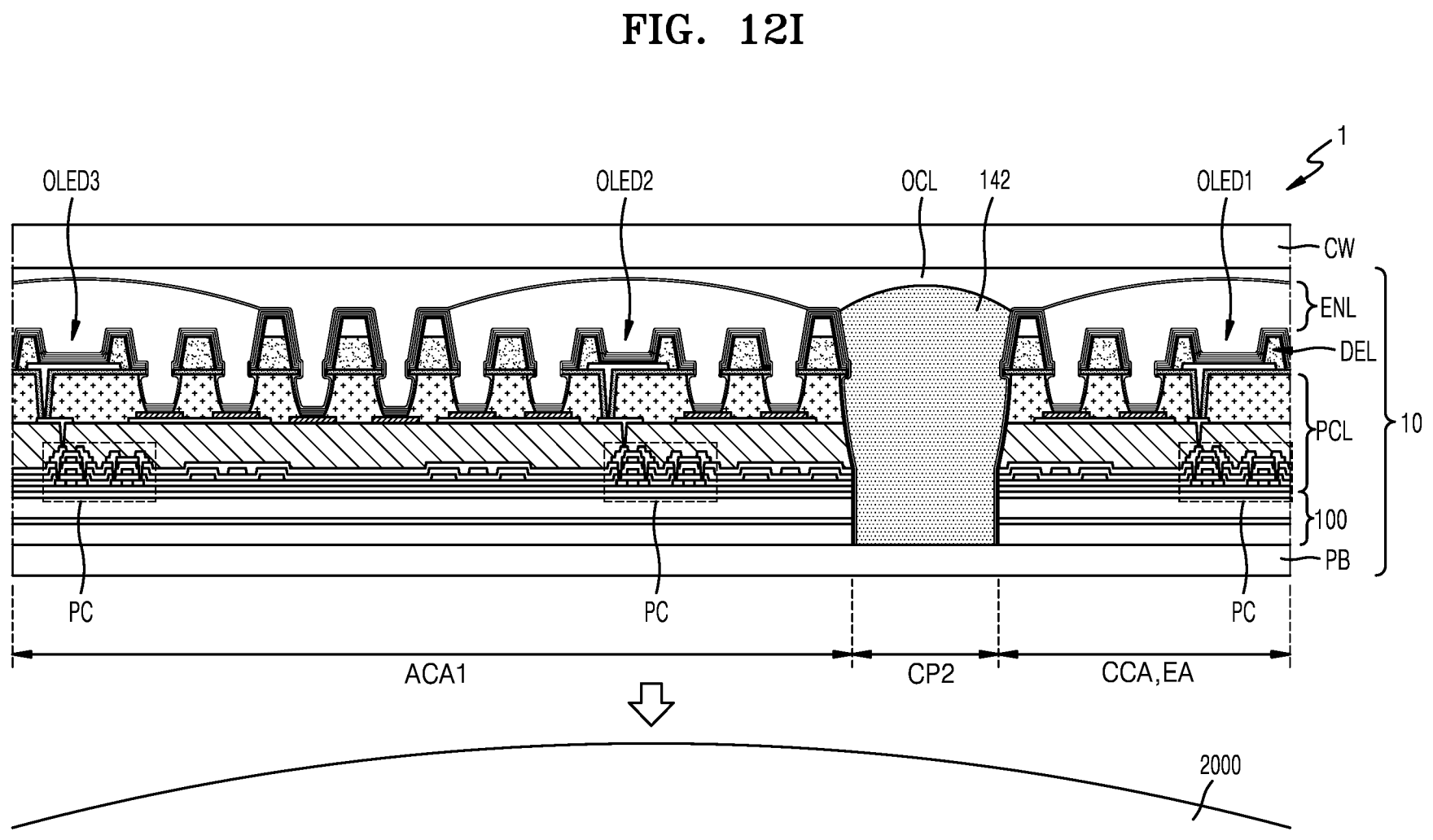

Referring to FIG. 12I, a cover window CW may be disposed on the encapsulation layer ENL on which the light-transmissive organic material layer OCL is formed, and the encapsulation layer ENL and the cover window CW may be bonded to each other. In this case, because a guide 2000 having a predetermined curvature is disposed under the display panel 10, the display panel 10 may be bent to have a curvature. Of course, the cover window CW may also have a curvature corresponding to the corner area.

In an embodiment, the cover window CW may be disposed on the display panel 10 in a state of having a curvature, and the display panel 10 may be bent between the guide 2000 and the cover window CW having a curvature. In another embodiment, the cover window CW may have a curvature by being bent together in a process of bending the display panel 10.

The organic filler (e.g., the second organic filler, 142) that has been temporarily cured in the process described above with reference to FIG. 12G may be secondarily cured in the process described above with reference to FIG. 12H or 12I. During the secondary curing, as the volume of the first to third organic fillers including the curable shrinkage material is reduced and the interval between the cutout patterns is narrowed, the corner area of the display panel 10 may be bent to have a curvature. Because the curable shrinkage material shrinks by a predetermined volume, the interval between the first adjacent corner area ACA1 and the central corner area CCA may be maintained, and unintended overlapping between the first adjacent corner area ACA1 and the central corner area CCA may be prevented. Similarly, the interval between the extension areas EA arranged in the central corner area CCA may be maintained, and unintended overlapping between the adjacent extension areas EA may be prevented. The interval between the second adjacent corner area and the central corner area CCA may also be maintained constant, and unintended overlapping between the second adjacent corner area and the central corner area CCA may be prevented.

As described above, embodiments may provide the display device which has the round image surface and in which the display area for displaying the image is expanded. Also, the interval between the extension areas arranged in the corner area of the display device may be maintained constant, and the reliability of the display device may be improved.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display device comprising:
   a substrate comprising a central area and a corner area, the corner area comprising a plurality of extension areas each extending in a direction away from the central area, the plurality of extension areas including distal portions spaced apart from each other;
   a plurality of display elements arranged on a front surface of the substrate and arranged in the central area and the plurality of extension areas; and
   a first organic filler between adjacent extension areas among the plurality of extension areas,
   wherein at least a portion of the first organic filler is disposed in a cutout pattern defined in the substrate between distal portions of the adjacent extension areas, and
   the adjacent extension areas and the first organic filler are disposed at a curved surface of the substrate which is different from a surface of the central area of the substrate.

2. The display device of claim 1, wherein the plurality of display elements comprises first display elements arranged in each of the plurality of extension areas, and
   the display device further comprises a plurality of organic patterns disposed on the substrate and surrounding the first display elements disposed in each of the plurality of extension areas.

3. The display device of claim 2, wherein a first portion of the first organic filler is between the adjacent extension areas of the substrate, and a second portion of the first organic filler is between an organic pattern disposed in a first extension area, which is one of the adjacent extension areas, and an organic pattern disposed in a second extension area, which is another one of the adjacent extension areas.

4. The display device of claim 1, wherein the first organic filler comprises polymer.

5. The display device of claim 1, further comprising an encapsulation layer covering the plurality of display elements and comprising at least one inorganic encapsulation layer and at least one organic encapsulation layer, wherein the at least one organic encapsulation layer comprises a first organic encapsulation area covering a first display element disposed in a first extension area, which is one of the adjacent extension areas, and a second organic encapsulation area covering a first display element disposed in a second extension area, which is another one of the adjacent extension areas, and the first organic encapsulation area and the second organic encapsulation area are spaced apart from each other with the first organic filler therebetween.

6. The display device of claim 5, further comprising a light-transmissive organic material layer on the encapsulation layer, wherein the light-transmissive organic material layer overlaps the first organic encapsulation area, the first organic filler, and the second organic encapsulation area.

7. The display device of claim 6, further comprising a cover window on the light-transmissive organic material layer, wherein a corner area of the cover window has a curvature and overlaps the adjacent extension areas and the first organic filler.

8. The display device of claim 1, further comprising a lower protection film disposed on a rear surface of the substrate.

9. The display device of claim 8, wherein the first organic filler is in direct contact with a portion of an upper surface of the lower protection film.

10. The display device of claim 1, wherein the corner area further comprises a first adjacent corner area adjacent to one outermost extension area among the plurality of extension areas, a distal portion of the one outermost extension area and a distal portion of the first adjacent corner area are physically connected to each other by a second organic filler between the one outermost extension area and the first adjacent corner area, and are spatially spaced apart from each other with the second organic filler therebetween, and the first organic filler and the second organic filler comprise a same material as each other.

* * * * *